United States Patent
Park

(10) Patent No.: US 10,743,198 B1
(45) Date of Patent: Aug. 11, 2020

(54) TRANSPORTATION INFRASTRUCTURE LOCATION AND REDEPLOYMENT

(71) Applicant: North Carolina A&T State University, Greensboro, NC (US)

(72) Inventor: Hyoshin Park, Greensboro, NC (US)

(73) Assignee: North Carolina Agricultural and Technical State University, Greensboro, NC (US)

( * ) Notice: Subject to any disclaimer, the term of this patent is extended or adjusted under 35 U.S.C. 154(b) by 0 days.

(21) Appl. No.: 16/254,474

(22) Filed: Jan. 22, 2019

Related U.S. Application Data

(60) Provisional application No. 62/620,232, filed on Jan. 22, 2018.

(51) Int. Cl.
*H04W 24/02* (2009.01)
*H04W 16/18* (2009.01)
*G08G 1/07* (2006.01)

(52) U.S. Cl.
CPC .............. *H04W 24/02* (2013.01); *G08G 1/07* (2013.01); *H04W 16/18* (2013.01)

(58) Field of Classification Search
CPC ......... H04W 24/02; H04W 16/18; G08G 1/07
USPC .......................................................... 340/917
See application file for complete search history.

(56) References Cited

U.S. PATENT DOCUMENTS

| | | | |
|---|---|---|---|
| 2002/0116118 A1* | 8/2002 | Stallard | G08G 1/01 701/117 |
| 2013/0013178 A1* | 1/2013 | Brant | G08G 1/0116 701/117 |
| 2016/0027299 A1* | 1/2016 | Raamot | G08G 1/08 340/917 |
| 2016/0042641 A1* | 2/2016 | Smith | G08G 1/0116 340/917 |
| 2016/0070261 A1 | 3/2016 | Heilman et al. | |
| 2016/0379486 A1* | 12/2016 | Taylor | G08G 1/0141 340/905 |
| 2017/0085632 A1 | 3/2017 | Cardote | |
| 2018/0005521 A1* | 1/2018 | Ryu | G08G 1/065 |
| 2018/0315307 A1* | 11/2018 | Epperlein | G08G 1/083 |
| 2019/0222652 A1* | 7/2019 | Graefe | H04Q 9/00 |

OTHER PUBLICATIONS

Argote-Cabanero, J., Christofa, E., and Skabardonis, A. (2015). Connected vehicle penetration rate for estimation of arterial measures of effectiveness. Transportation Research Part C: Emerging Technologies, 60, 298-312.

Chong, L. and Osorio, C. (2017). A simulation-based optimization algorithm for dynamic large-scale urban transportation problems. Transportation Science, 52(3), 637-656.

Christofa, E., Argote, J., & Skabardonis, A. (2013). Arterial queue spillback detection and signal control based on connected vehicle technology. Transportation Research Record, 2366(1), 61-70.

(Continued)

*Primary Examiner* — Hirdepal Singh
(74) *Attorney, Agent, or Firm* — Fox Rothschild LLP

(57) ABSTRACT

An approach is disclosed that reduces traffic network delays by identifying optimal sensor locations for one or more time periods and by controlling traffic signals through optimized sensor deployment.

20 Claims, 21 Drawing Sheets

(56) References Cited

OTHER PUBLICATIONS

Gentili, M. and Mirchandani, P. (2012).. Locating sensors on traffic networks: Models, challenges and research opportunities. Transportation research part C: emerging technologies, 24, 227-255.

Haghani, A., Hamedi, M., Park, H., Aliari, Y., and Zhang, X. (2013). I-95 corridor coalition vehicle probe project: Validation of INRIX data. Dept. of Civil & Environmental Engineering, Univ. of Maryland, College Park.

Larson, R. C. (1978). Markov models of signpost sensor ALV systems. Transportation Science, 12(4):331-352.

Maitipe, B., Hayee, M., and Kwon, E. (2011). Vehicle-to-infrastructure traffic information system for the work zone based on dedicated short-range communication. Transportation Research Record: Journal of the Transportation Research Board, 2243:67-73.

Osorio, C. and Bierlaire, M. (2013). A simulation-based optimization framework for urban transportation problems. Operations Research, 61(6), 1333-1345.

Park, H. and Haghani, A. (2015). Optimal number and location of bluetooth sensors considering stochastic travel time prediction. Transportation Research Part C: Emerging Technologies, 55, 203-216.

Ramezani, M., and Geroliminis, N. (2015) Queue profile estimation in congested urban networks with probe data. Computer-Aided Civil and Infrastructure Engineering, 30, 414-432.

Stout, L. and Yost, A. (2011). Portable traffic signals in the work zone. International Municipal Signal Association, (Mar./Apr.):37-35.

Viti, F., Rinaldi, M., Corman, F., and Tampère, C. M. (2014). Assessing partial observability in network sensor location problems. Transportation Research Part B: Methodological, 70(Supplement C):65-89.

Zhang, J., Jia, L., Niu, S., Zhang, F., Tong, L., and Zhou, X. (2015). A space-time network-based modeling framework for dynamic unmanned aerial vehicle routing in traffic incident monitoring applications. Sensors, 15(6):13874-13898.

\* cited by examiner

| Symbol | Definition |
| --- | --- |
| Sets | |
| $\mathcal{A}$ | Set of road links |
| $\mathcal{N}$ | Set of nodes (intersections) |
| $\mathcal{D}$ | Set of demand patterns |
| $\mathcal{M}_{(i)}$ | Set of phases for intersection $i$ |
| $\mathcal{G}$ | Set of all feasible green time splits |
| $\mathcal{H}$ | Set of all traffic directions in an intersection |
| $\mathcal{T}$ | Set of all periods |
| $\mathcal{K}$ | Set of all intervals |
| $\Xi_\omega$ | Set of pre-selected neighborhood structure |
| $\Xi_v$ | Set of neighborhood structure used in local search |
| $\Lambda$ | Set of location decision vector that has future relocations defined |
| $\Pi, Y$ | Set of location decision vectors in submodular property |
| $\varphi$ | The best solution with $c$ sensors as a subset of $\Pi$ |
| $\upsilon$ | The best solution with $c+1$ sensors as a subset of $Y$ |
| $\varnothing$ | Submodular empty set |
| Superscripts, subscripts | |
| $t \in \mathcal{T}$ | Superscript for period |
| $m \in \mathcal{M}_{(i)}$ | Superscript for signal phasing for each intersection $i$ |
| $k \in \mathcal{K}$ | Superscript for time interval $k$ during period $t$ |
| $i \in \mathcal{N}$ | Subscript for node (intersection) |
| $a \in \mathcal{A}$ | Subscript for link |
| $d \in \mathcal{D}$ | Subscript for demand pattern |
| $h \in \mathcal{H}$ | Subscript for traffic direction |
| Parameters | |
| $\Omega$ | Network domain with sensors and without sensors |
| $\Gamma$ | Interface between network domains |
| $\xi_{(d)}^t$ | A particular realization of uncertain traffic demand pattern $d \in \mathcal{D}$ at period $t$ |
| $a_{(i)(h)}$ | Subscript for link $a$ of intersection $i$ to direction $h$ |
| $\sigma_{a_{(i)(h)}}$ | Queue thresholds for link $a$ of intersection $i$ to direction $h$ |
| $\gamma_{a_{(i)(h)}}$ | Green time allocation weight for link $a$ of intersection $i$ to direction $h$ |
| $\mu$ | The optimal policy mapping states to actions in dynamic programming |
| $\alpha$ | Main effects in the meta model |
| $\beta$ | Interaction effects in the meta model |
| $\theta$ | Queue length thresholds to trigger signal control |
| $\lambda$ | Lagrangian relaxation variable |
| $\delta$ | Subgradiant of Lagrangian relaxation |
| $\epsilon$ | Error term in the meta model |
| $\zeta$ | Step size in the Lagrangian heuristic |
| $\eta$ | Updated step size |

FIG. 2A

| Variables | |
|---|---|
| $u_{a_{(i)(h)}}(k)$ | Entry number of vehicles (flow) on intersection $i$, link $a$ to direction $h$ at time $k$ |
| $a_h$ | links in four directions $h$ |
| $u^{rs}_{a_{(i)}}(k)$ | Entry flow on link $a$ along path $p$ from origin $r$ to destination $s$ at time $k$ |
| $\phi_i$ | Delay savings with sensor location selection at intersection $i$ |
| $c$ | Maximum number of available sensors |
| $b_{(1)}$ | Relocation budget allocated for period $t \in \mathcal{T}$; either spent or carried over to the next period |
| $b_{(2)}$ | Budget constraint on total sensor relocation cost available for period $t \in \mathcal{T}$ |
| $b_{(3)}$ | Budget constraint on relocation cost for one day operation $\mathcal{T}$ |
| $G^m_{(i)}(k)$ | Green time for phase $m$ of intersection $i$ at time $k$ |
| $G^{m,min}_{(i)}$ | Minimum green time for phase $m$ of intersection $i$ |
| $g^m_i(k)$ | Green split for phase $m$ of intersection $i$ at time $k$ |
| $s_{(a)}$ | Saturation flow rate for link $a$ |
| $q^m_{(i)(a)}$ | 1 if link $a$ is in phase $m$ at time $t$; 0 otherwise |
| $x^t_{(i)}$ | 1 if a sensor is installed on intersection $i$ at time period $t$, 0 otherwise |
| $S^t$ | The state variable at period $t$ that depends on the location at $t-1$ and demand realization at $t$ |
| $y^t_{(j)(i)}$ | Linkage variable: 1 if a sensor is relocated from $j$ to 1 in the current period $t$, and 0 otherwise |
| $z^t_{(i)}$ | 1 if node $i$ has a new sensor, -1 if a sensor is relocated to another location, and 0 no relocation |
| Functions: | |
| $f(\varphi), f(v)$ | Submodular property functions for an counter example with solution set $\varphi, v$. |
| $t_{(a)}(t)$ | Travel cost on link $a$ for flows entering the link at period $t$ |
| $\psi^t(x^t_{(i)})$ | Expected delay savings under current stage $t$ decision at intersection $i$ |

FIG. 2B

/Step 1: Initialization/
Initialize the parameter of the algorithm;
set the step size $\zeta := 1$;
set the Lagrangian variables $\lambda_j := 0, j \in J$;
set initial bounds $Ubd = \infty$ and $Lbd = 0$;
Calculate $\lambda = 0$;
while iterations $\zeta = \frac{\zeta}{2}$ do
  /Step 2:/
  set the $\tilde{x}^t$ and $\tilde{y}^t$ as the optimal solutions of the two subproblems;
  Set the initial upper bounds $Ubd = min(Ubd, L_1(\lambda) + L_2(\lambda))$;
  /Step 3:/
  Calculate a feasible solution of $\tilde{y}^t$, and find associated max $DelaySavings$ $\sum_{t=1}^{T} \mathbb{E}_{\xi^1, \xi^2, ..., \xi^T} \left[ \psi^t(\tilde{x}^\Lambda, \xi^t) \right]$) using VNS;
  Update lower bound $Lbd = max(Lbd, \sum_{t=1}^{T} \mathbb{E}_{\xi^1, \xi^2, ..., \xi^T} \left[ \psi^t(\tilde{x}^\Lambda, \xi^t) \right])$;
  /Step 4:/
  Calculate subgradiant $\delta_i^t(\lambda) = \tilde{y}_j^t - \tilde{x}_j^t$ for $i = j$;
  Calculate step size $\eta := \zeta(Ubd - Lbd)$;
  Set $\lambda^t := max\left[0, \lambda_j^t - \eta \delta_j^t(\lambda)\right]$;
  /Step 5:/
  if $Ubd \geq \sum_{t=1}^{T} \mathbb{E}_{\xi^1, \xi^2, ..., \xi^T} \left[ \psi^t(\tilde{x}^\Lambda, \xi^t) \right]$) in 500 iterations then
    stop and $Ubd := \sum_{t=1}^{T} \mathbb{E}_{\xi^1, \xi^2, ..., \xi^T} \left[ \psi^t(\tilde{x}^\Lambda, \xi^t) \right]$)
  else
    go to step 2
  end if
  if $100 \times \frac{(Ubd - Lbd)}{Ubd} \leq \sigma$ then
    stop
  else
    go to step 2
  end if
end while

FIG. 4

Initialization: Select the set of neighborhood structures $\div_\omega$ and $\Xi_v$;
Input: Find initial solution $\tilde{x} \leftarrow StartingSolution$;
Output: $DelaySavings(\tilde{x}) = \sum_{t=1}^{T} \mathbb{E}_{\xi^1,\xi^2,...,\xi^\tau}\left[\psi^t(\tilde{x}^\Lambda, \xi^t)\right]$  $(\tilde{x}^1 = \tilde{x}^2 = \cdots = \tilde{x}^t)$;
for $\omega = 1$ to $\omega_{max}$; do
    repeat the following steps:
    / Shaking/
    for $i = 1$ to $N$ do
        if $(DelaySavings(\tilde{x}') > DelaySavings(\tilde{x}))$ then
            $\tilde{x}^* \leftarrow \tilde{x}'$
            $BestSavings \leftarrow DelaySavings(\tilde{x}')$;
            $iteration \leftarrow 0$;
        end if
    end for / Local search/
    for $v = 1$ to $v_{max}$; do
        if $(DelaySavings(\tilde{x}'') > DelaySavings(\tilde{x}'))$ then
            $\tilde{x}' \leftarrow \tilde{x}''$;
            $v \leftarrow 1$;
        else
            $v \leftarrow v + 1$;
        end if
    end for / Move or not /
    if $(DelaySavings(\tilde{x}'') > BestSavings)$ then
        $\tilde{x}^* \leftarrow \tilde{x}''$
        $BestSavings \leftarrow DelaySavings(\tilde{x}'')$;
        $iteration \leftarrow 0$;
    else
        $\tilde{x}'' \leftarrow AcceptanceCriteria(\tilde{x}^*, \tilde{x}'')$;
    end if
    $\tilde{x} \leftarrow \tilde{x}''$;
end for

FIG. 5

| Budget | $t=1$ Location | $t=2$ Location | $t=3$ Location | Total delay savings (Indirect %) | CPU (s) |
|---|---|---|---|---|---|
| $c=2$ sensors | 8, 13 | 7, 8 | 1, 5 | 872 s (2.1 %) | 537 |
| $c=3$ sensors | 14, 15, 16 | 8, 9, 11 | 8, 9, 11 | 1,058 s (6.6 %) | 598 |
| $c=4$ sensors | 13, 14, 15, 16 | 7, 8, 9, 11 | 1, 7, 8, 9 | 1,202 s (7.9 %) | 667 |
| $c=5$ sensors | 10, 13, 14, 15, 16 | 7, 8, 9, 11, 13 | 1, 7, 8, 9, 13 | 1,270 s (9.3 %) | 735 |
| $c=6$ sensors | 5, 10, 13, 14, 15, 16 | 5, 7, 8, 9, 11, 13 | 1, 5, 7, 8, 9, 13 | 1,338 s (10.8 %) | 719 |
| $c=7$ sensors | 5, 10, 13, 14, 15, 16, 18 | 5, 7, 8, 9, 11, 13, 18 | 1, 5, 7, 8, 9, 13, 18 | 1,397 s (12.5 %) | 638 |
| $c=8$ sensors | 4, 5, 10, 13, 14, 15, 16, 18 | 4, 5, 7, 8, 9, 11, 13, 18 | 1, 4, 5, 7, 8, 9, 13, 18 | 1,450 s (14.4 %) | 595 |
| $c=9$ sensors | 4, 5, 10, 12, 13, 14, 15, 16, 18 | 4, 5, 7, 8, 9, 11, 12, 13, 18 | 1, 4, 5, 7, 8, 9, 12, 13, 18 | 1,494 s (16.5 %) | 543 |

FIG. 7A

| Budget | $t=1$ Location | $t=2$ Location | $t=3$ Location | Total savings (s) | Gap (%) | CPU (s) |
|---|---|---|---|---|---|---|
| $c=2$ sensors | 8, 15 | 8, 15 | 8, 15 | 520 | 40.37 | 129 |
| $c=3$ sensors | 7, 8, 15 | 7, 8, 15 | 7, 8, 15 | 675 | 36.20 | 160 |
| $c=4$ sensors | 7, 8, 13, 15 | 7, 8, 13, 15 | 7, 8, 13, 15 | 836 | 30.45 | 182 |
| $c=5$ sensors | 8, 9, 11, 14, 15 | 8, 9, 11, 14, 15 | 8, 9, 11, 14, 15 | 976 | 23.15 | 210 |
| $c=6$ sensors | 1, 8, 9, 11, 14, 15 | 1, 8, 9, 11, 14, 15 | 1, 8, 9, 11, 14, 15 | 1,118 | 16.44 | 173 |
| $c=7$ sensors | 1, 8, 9, 11, 13, 14, 15 | 1, 8, 9, 11, 13, 14, 15 | 1, 8, 9, 11, 13, 14, 15 | 1,224 | 12.38 | 150 |
| $c=8$ sensors | 1, 5, 8, 9, 11, 13, 14, 15 | 1, 5, 8, 9, 11, 13, 14, 15 | 1, 5, 8, 9, 11, 13, 14, 15 | 1,298 | 10.48 | 134 |
| $c=9$ sensors | 1, 5, 8, 9, 11, 13, 14, 15, 18 | 1, 5, 8, 9, 11, 13, 14, 15, 18 | 1, 5, 8, 9, 11, 13, 14, 15, 18 | 1,358 | 9.10 | 122 |

FIG. 7B

| Budget | t = 1 Location | t = 2 Location | t = 3 Location | Total savings (s) | Gap (%) | CPU (s) |
|---|---|---|---|---|---|---|
| c = 2 sensors | 8, 15 | 8, 15 | 5, 15 | 648 | 25.69 | 411 |
| c = 3 sensors | 7, 8, 15 | 1, 8, 15 | 1, 5, 15 | 794 | 24.95 | 439 |
| c = 4 sensors | 7, 8, 13, 15 | 1, 8, 13, 15 12 | 1, 5, 13, 15 | 980 | 18.47 | 527 |
| c = 5 sensors | 8, 9, 14, 15, 16 | 8, 9, 14, 15, 16, 12 | 8, 9, 11, 14, 15 | 1,122 | 11.65 | 474 |
| c = 6 sensors | 7, 8, 9, 14, 15, 16 | 1, 8, 9, 14, 15, 16 | 1, 8, 9, 11, 14, 15 | 1,254 | 6.28 | 446 |
| c = 7 sensors | 7, 8, 9, 13, 14, 15, 16 | 1, 8, 9, 13, 14, 15, 16 | 1, 8, 9, 11, 13, 14, 15 | 1,324 | 5.23 | 390 |
| c = 8 sensors | 5, 7, 8, 9, 13, 14, 15, 16 | 1, 5, 8, 9, 13, 14, 15, 16 | 1, 5, 8, 9, 11, 13, 14, 15 | 1,396 | 3.72 | 376 |
| c = 9 sensors | 5, 7, 8, 9, 13, 14, 15, 16, 18 | 1, 5, 8, 9, 13, 14, 15, 16, 18 | 1, 5, 8, 9, 11, 13, 14, 15, 18 | 1,454 | 2.68 | 337 |

FIG. 7C

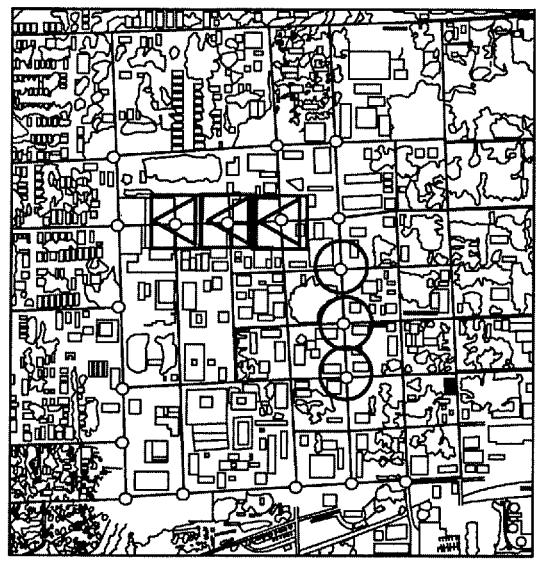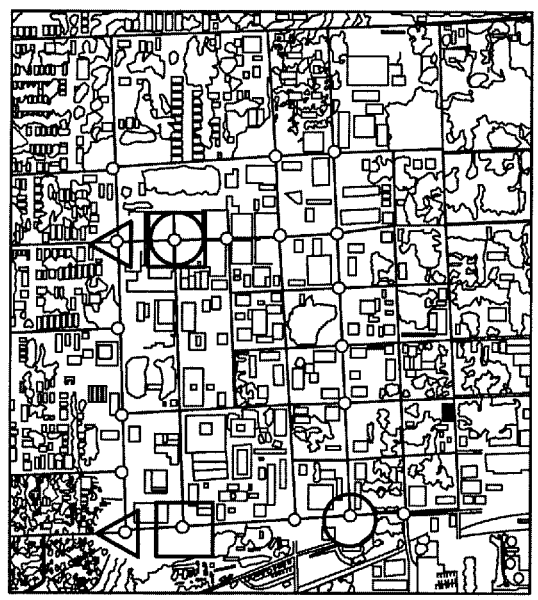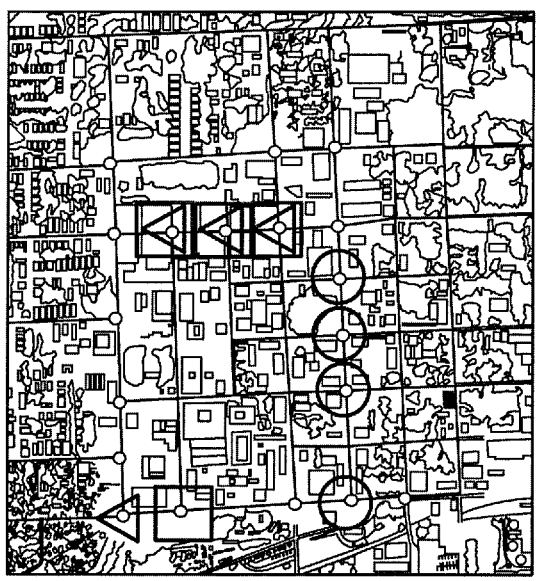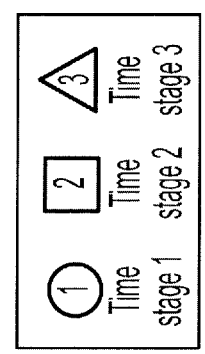
FIG. 8A

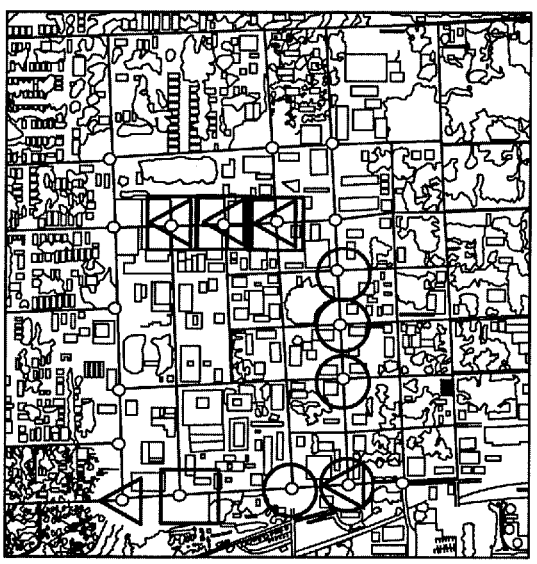
(d) Sensor deployment plan c= 5
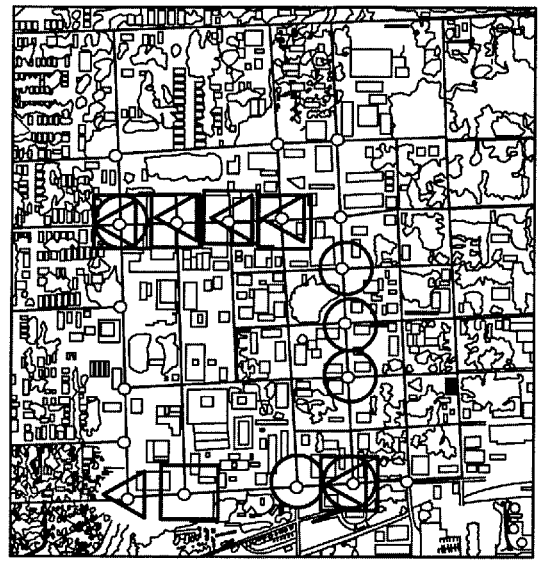
(e) Sensor deployment plan c= 6
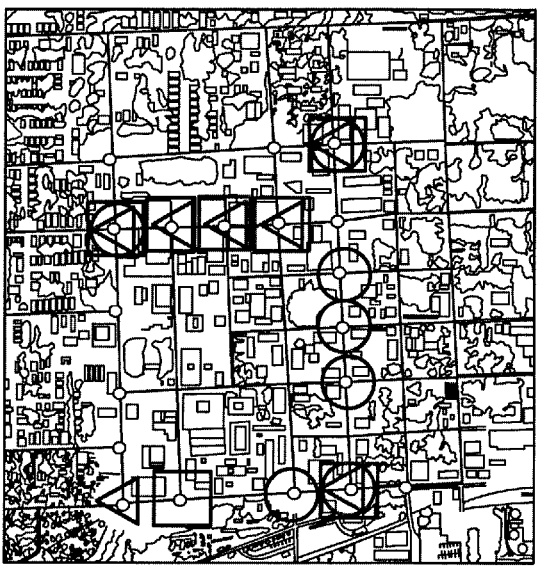
(f) Sensor deployment plan c= 7
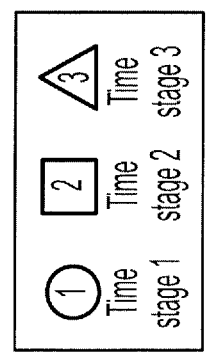
○ 1 Time stage 1
□ 2 Time stage 2
△ 3 Time stage 3
FIG. 8B

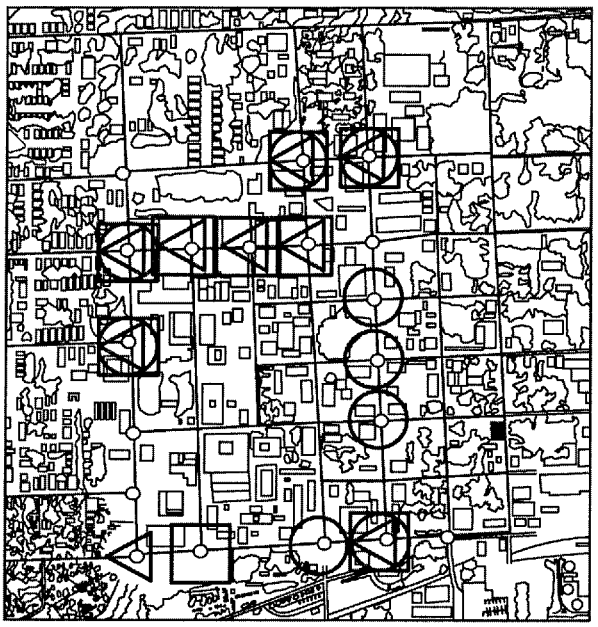
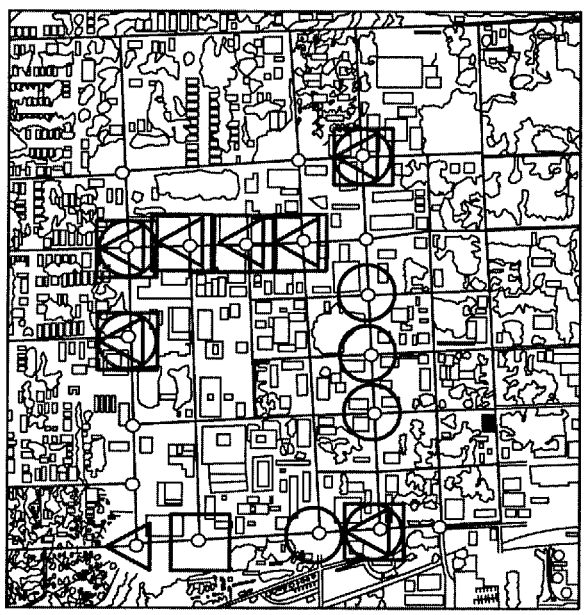
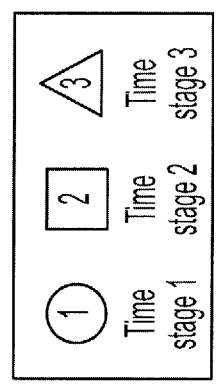
FIG. 9A

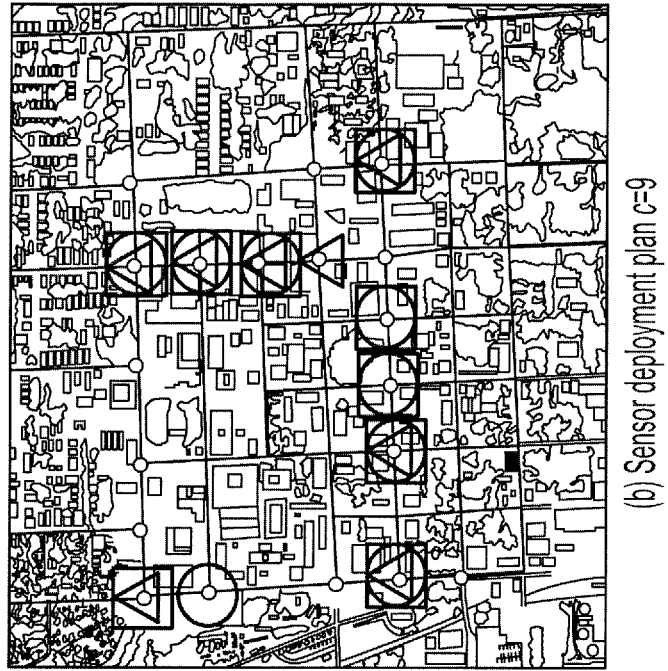
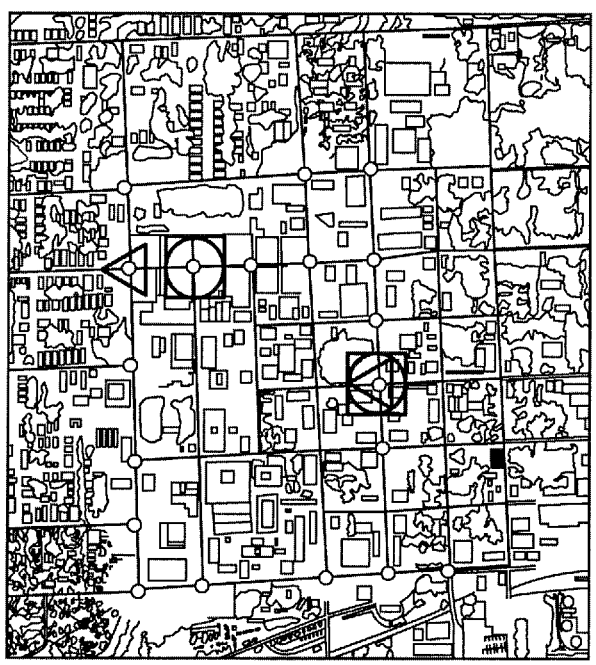
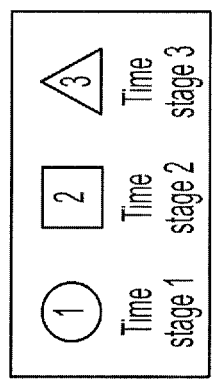
FIG. 9B

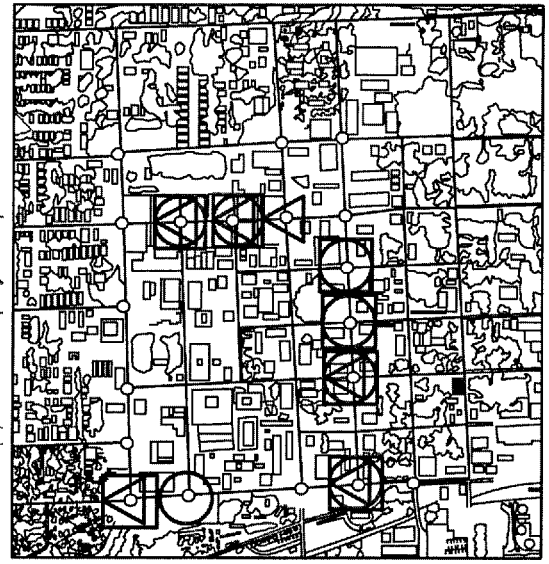
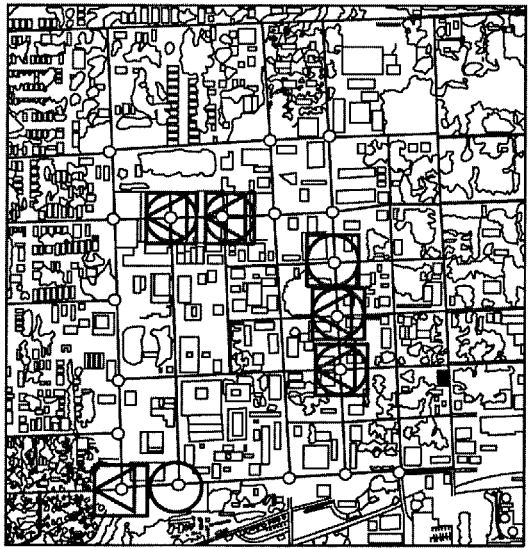
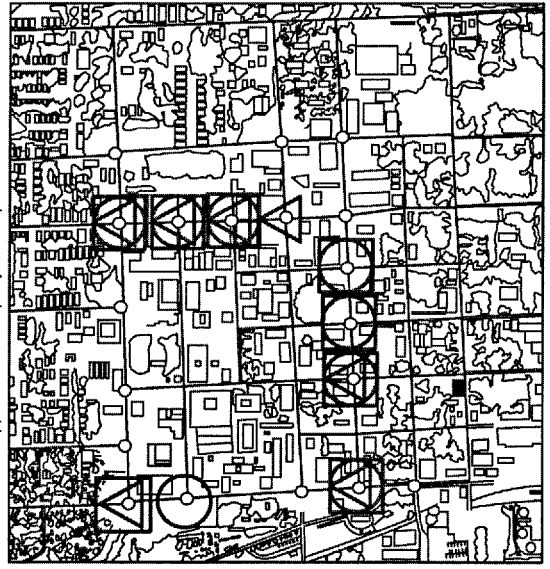
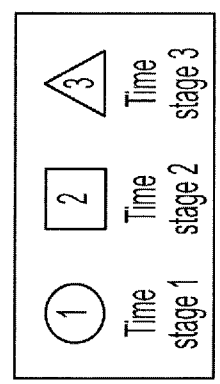
FIG. 10B

TRANSPORTATION INFRASTRUCTURE LOCATION AND REDEPLOYMENT

CROSS-REFERENCE TO RELATED APPLICATION

This Application claims benefit to U.S. Provisional Application No. 62/620,232 filed on Jan. 22, 2018.

BACKGROUND

Wireless connectivity among vehicles, infrastructure, and mobile devices has brought about innovative solutions to improve the safety and mobility of transportation systems. One of the more promising solutions utilizes the deployment of Bluetooth sensors that anonymously use the machine access control address of a cell phone without privacy concerns. However, on arterial networks, latency issues hinder the full potential of Bluetooth technology, and because individuals must enable discovery mode on their mobile phones for the technology to work, market penetration using Bluetooth technology is relatively flat. An alternative solution utilizes connected vehicle (CV) technology, which allows a vehicle to share data with devices inside the vehicle and to other devices outside of the vehicle, such as another vehicle or roadside sensor.

Some CV technology includes dedicated short-range communications (DSRC) that enable onboard equipment (OBE) of a vehicle to interact with the OBE of other vehicles and to transmit information to the roadside sensors. However, despite the significant potential benefits of optimizing sensor locations, the challenges associated with identifying optimal sensor locations for multiple time stages throughout a day with uncertain demand patterns have received little attention.

Conventional applications related to sensor positioning have focused on locating permanently installed sensors to enhance the quality of traffic origin-destination (OD) demand or travel time estimations. These permanently installed sensors may produce meaningful information for traffic management, but are constrained by their lack of portability. For example, a permanently installed sensor that may provide useful data during the morning rush hour, but may produce meaningless information in the afternoon when traffic patterns change. In practice, sensors are often located at locations with high likelihood of recurrent congestion during peak or off-peak periods. However, given cost considerations associated with purchasing and installing the sensors, it is not economically feasible to permanently install the sensors at every congested location.

Typically, to identify where to locate and install a roadside sensor, i.e., the sensor location problem (SLP), involves selecting certain arcs or nodes for the sensors. Depending on the traditional detection technologies (e.g., loop, image, fixed vehicle identification (ID) and more recent technologies (e.g., portable vehicle and path ID), the existing problems differ according to different types of sensors and measurement of interests. Based on the capability of a sensor, traffic measurements that have been used in SLP studies are (1) OD flow observability, (2) OD flow estimation, (3) travel time, and (4) signal control.

OD flow observability, inspired by covering location models, provides full or partial flow observability for the sensor coefficient matrix. Two types of OD flow observability problems may include: full flow-observability problems having counting sensors located on links to observe either OD trips or route/link flows, or located on nodes and known split ratios; and partial flow-observability problems having path ID sensors located on links to observe route flows or vehicle ID sensors located on the links of the network. OD flow estimation estimates the traffic flow without full rank to overcome the underestimation. The third problem attempts to find different sensor location layouts to minimize the traffic measurement errors such as density and flow. The fourth problem utilizes adaptive traffic control to estimate incoming volumes and queue blocking probability using traditional sensors.

These SLP problems concentrate on traffic volume coverage with maximum information gain at permanent sensor locations. However, traditional traffic volume detectors have several disadvantages, which require extensive modeling efforts to quantify the uncertainty generated by the detectors. For example, as up to half of inductance loop detectors may malfunction during a given time period, advanced algorithms are employed to overcome measurement errors of the inductance loop detectors (single and dual). However, making adjustments to inductance loop detectors and video detection in order to provide the level of detection needed to be fully adaptive to real-time traffic is oftentimes inaccurate, expensive, and unreliable. Additionally, the adjustments of the detectors can be limited in physical range.

As an alternative, traffic signal coordination may utilize Bluetooth sensors placed along roads that can track Bluetooth devices in passing vehicles, which may detect and record how long a car takes to drive along a corridor, segment by segment. Compared to the traditional method, depending on the point speed at sensors fixed locations, Bluetooth technology may provide point-to-point travel time over the segments. However, for arterial signal control, this point-to-point detection-based Bluetooth technology still has latency issues.

There is a specific need to optimize the location and deployment of roadside sensors under budget. Specifically, it is essential to decide where best to locate sensors to maximize the benefit of CV deployment.

SUMMARY

The disclosure herein relates generally to transportation systems, and more particularly, to methods, apparatus, and products for reducing network delays by controlling traffic signals through an optimized sensor deployment.

The summary of the disclosure is given to aid understanding of transportation systems that optimize sensor deployment and control traffic signals to reduce network delays, and not with an intent to limit the disclosure or the invention. The present disclosure is directed to a person of ordinary skill in the art. It should be understood that various aspects and features of the disclosure may advantageously be used separately in some instances, or in combination with other aspects and features of the disclosure in other instances. Accordingly, variations and modifications may be made to the data processing system, the fail recognition system, and their method of operation to achieve different effects.

A method of reducing one or more network delays by controlling traffic signals through an optimized sensor deployment is disclosed. The method may include: receiving traffic data from one or more sensors; detecting a queue spillback for an intersection; detecting a phase of a plurality of phases causing the queue spillback; calculating an optimal distribution of a green time for each of phase in the plurality of phases; selecting a location for each of the one or more sensors based on the optimal distribution of the green time for each phase; deploying the one or more sensors to the respective locations; connecting the one or more sensors to a respective traffic signal controller, the traffic signal controller connected to a traffic light; and distributing the green time to the one or more sensors to control the green time for a respective traffic light.

A computer program product may include a non-transitory computer-readable storage medium having program instructions embodied therewith for reducing one or more network delays by controlling traffic signals through an optimized sensor deployment. The program instructions may be executable by one or more processors to execute: receiving traffic data from one or more sensors; detecting a queue spillback for an intersection; detecting a phase of a plurality of phases causing the queue spillback; calculating an optimal distribution of a green time for each of phase in the plurality of phases; selecting a location for each of the one or more sensors based on the optimal distribution of the green time for each phase; deploying the one or more sensors to the respective locations; connecting the one or more sensors to a respective traffic signal controller, the traffic signal controller connected to a traffic light; and distributing the green time to the one or more sensors to control the green time for a respective traffic light.

A sensor deployment system for reducing one or more network delays by controlling traffic signals through an optimized sensor deployment is provided. The sensor deployment system may include: one or more sensors connected to a traffic light via a traffic signal controller and configured to collect traffic data; and a simulator configured to detect a queue spillback for an intersection, detect a phase of a plurality of phases causing the queue spillback, calculate an optimal distribution of a green time for each of phase in the plurality of phases, and select a location for each of the one or more sensors based on the optimal distribution of the green time for each phase. The one or more sensors may be deployed to the respective locations and connected to the traffic signal controller. The system may be configured to distribute the green time to the one or more sensors to control the green time for a respective traffic light.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

The various aspects, features and embodiments of the data processing system, and their method of operation will be better understood when read in conjunction with the figures provided. Embodiments are provided in the figures for the purpose of illustrating aspects, features, and/or various embodiments of the data processing system, the redeployment system, and their method of operation, but the claims should not be limited to the precise arrangement, structures, features, aspects, assemblies, systems, embodiments, or devices shown, and the arrangements, structures, subassemblies, features, aspects, methods, processes, embodiments, and devices shown may be used singularly or in combination with other arrangements, structures, assemblies, subassemblies, systems, features, aspects, embodiments, methods and devices.

FIGS. 2A and 2B describe the notation, including sets, superscripts, parameters, variables, and functions, discussed herein.

FIG. 4 illustrates a cutting plane algorithm.

FIG. 5 illustrates a Variable Neighborhood Search.

FIG. 7A illustrates optimal deployment plans with flexible relocations. FIG. 7B illustrates optimal deployment plans without relocation. FIG. 7C illustrates optimal deployment plans with limited relocation.

FIGS. 8A-8B illustrates Flexible Relocations.

FIG. 9A illustrates dynamic sensor installations with flexible relocations. FIG. 9B illustrates dynamic sensor installations with limited relocations.

FIGS. 10A-10B illustrates sensor installation with limited relocation.

DETAILED DESCRIPTION

The following description is made for illustrating the general principles of the invention and is not meant to limit the inventive concepts claimed herein. In the following detailed description, numerous details are set forth in order to provide an understanding of the data processing system, the redeployment system, and their method of operation thereof; however, it will be understood by those skilled in the art that different and numerous embodiments of the data processing system, the redeployment system, and their method of operation may be practiced without those specific details, and the claims and disclosure should not be limited to the embodiments, subassemblies, features, processes, methods, aspects, features or details specifically described and shown herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an" and "the" include plural referents unless otherwise specified, and that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following discussion omits or only briefly describes conventional features of information processing systems, including processors and microprocessor systems and architectures, which are apparent to those skilled in the art. It is assumed that those skilled in the art are familiar with the general architecture of processors, and in particular with processors which operate in an out-of-order execution fashion. It may be noted that a numbered element is numbered according to the figure in which the element is introduced, and is typically referred to by that number throughout succeeding figures.

Exemplary methods, apparatus, and products transportation systems, and more particularly, for reducing network delays by controlling traffic signals through an optimized sensor deployment in accordance with the present disclosure are described further below with reference to the Figures.

Figure 1:
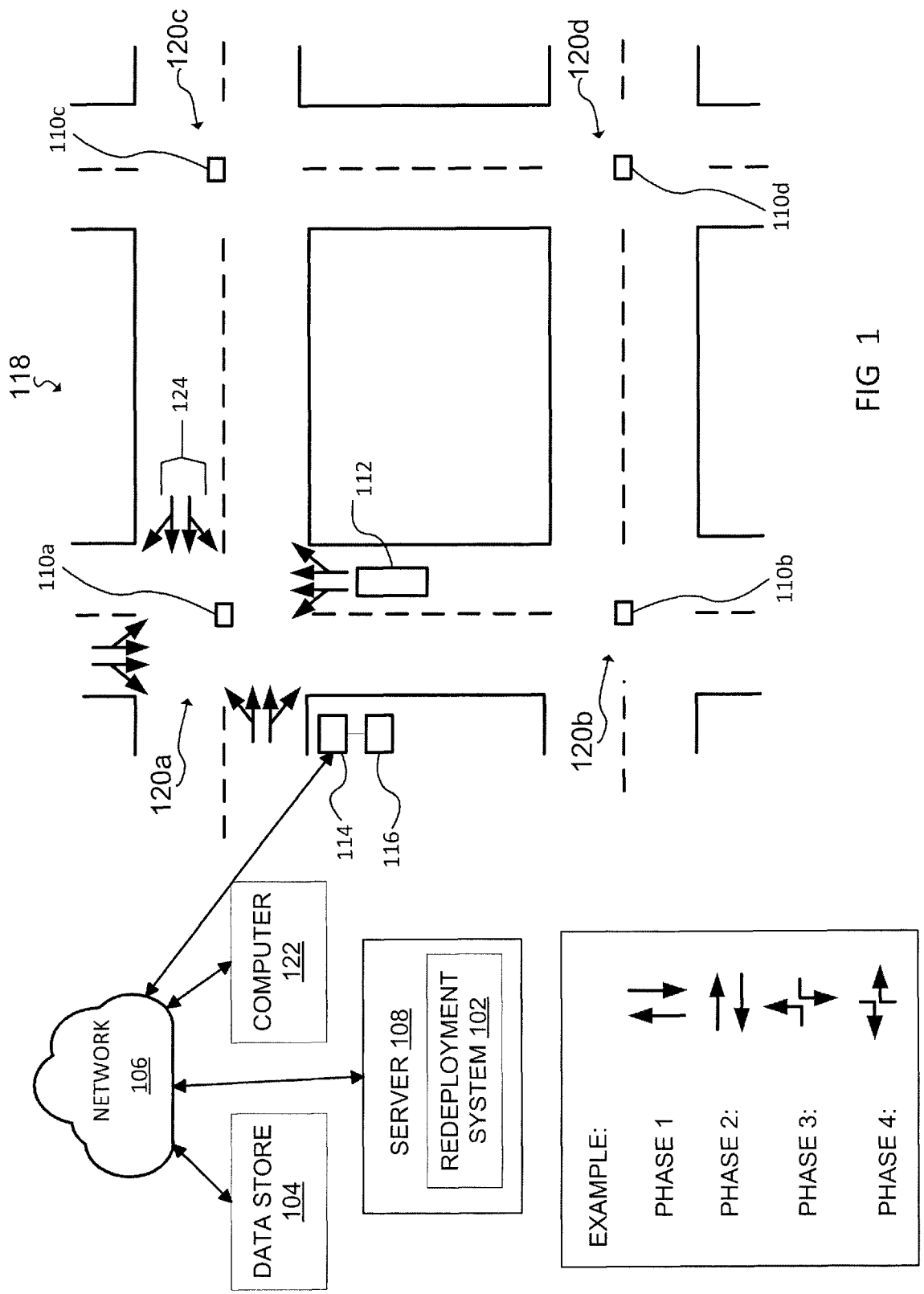
FIG. 1 is a functional block diagram illustrating a data processing environment and a transportation network.

FIG. 1 is a functional block diagram illustrating a data processing environment 100 and transportation network 118. FIG. 1 provides only an illustration of one implementation and does not imply any limitations with regard to the environments and networks, in which different embodiments may be implemented. Many modifications to the depicted environment and network may be made by those skilled in the art without departing from the scope of the embodiments herein. Data processing environment 100 includes a network 106, a server 108, which operates the redeployment system 102, and a data store 104. The transportation network 118 includes one or more intersections, such as intersection 120a, 120b, 120c, and 120d, one or more traffic lights, such as traffic light 110a, 110b, 110c, and 110d, one or more traffic signal controllers, such as traffic signal controller 116, one or more roadside sensors, such as roadside sensor 114, and one or more connected vehicles (CV), such as CV 112.

Each roadside sensor is connected to the redeployment system 102 via the network 102. A roadside sensor may also integrate with a traffic light, via a respective traffic signal controller, in order to send signals to the traffic light to control the traffic light. For example, the roadside sensor 114 may be connected and integrated with traffic signal controller 116 to control the traffic light 110a (e.g., by changing the phase of the traffic light, changing the timing between switching phases, etc.). The CV 112 may be configured to transmit information to the roadside sensors.

The roadside sensors may be point sensors (e.g., traffic loop detectors) and/or point-to-point sensors (e.g., automatic vehicle identification detectors). Point sensors and point-to-point sensors may support close/open loop calibrations to validate the proposed simulation against real-world speed and travel time on the network. The roadside sensors may be a portable CV-based sensor, which are fully portable and can be easily installed at any work-zone site. The initial setup of portable CV-based sensors requires a quick and simple configuration of input parameters of the road to be monitored.

Network 106 can be, for example, a local area network (LAN), a telecommunications network, a wide area network (WAN), such as the Internet, a virtual local area network (VLAN), or any combination that can include wired, wireless, or fiber optic connections. Network 106 can also include wire cables, wireless communication links, fiber optic cables, routers, switches and/or firewalls. Network 106 interconnects server 108, data store 104, the one or more roadside sensors, the one or more traffic signal controllers, the one or more CVs, and the redeployment system 102. In general, network 106 can be any combination of connections and protocols capable of supporting communications between server 108, data store 104, the one or more roadside sensors, the one or more traffic signal controllers, the one or more CVs, and the redeployment system 102.

Server 108 can be a web-based server hosting redeployment system 102. Server 108 can be a web server, a blade server, a computer including one or more processors and at least one non-transitory computer readable memory, a mobile computing device, a laptop computer, a tablet computer, a netbook computer, a personal computer (PC), a desktop computer, or any programmable electronic device or computing system capable of receiving and sending data, via network 106, and performing computer-readable program instructions. Server 108 can also be a data center, consisting of a collection of networks and servers providing an IT service, such as virtual servers and applications deployed on virtual servers, to an external party. Server 108 may also represent a computing system utilizing clustered computers and components (e.g., database server computer, application server computers, etc.) that act as a single pool of seamless resources, such as in a cloud computing environment, when accessed within data processing environment 100.

Data store 104 may store data including, but not limited to, one or more models and related parameters and collected data further discussed below. Data store 104 can be one of, a web server, a mobile computing device, a laptop computer, a tablet computer, a netbook computer, a personal computer (PC), a desktop computer, or any programmable electronic device or computing system capable of receiving, storing, and sending files and data, and performing computer readable program instructions capable of communicating with server 108, the one or more roadside sensors, and the one or more traffic signal controllers. Data store 104 can also represent virtual instances operating on a computing system utilizing clustered computers and components (e.g., database server computer, application server computers, etc.) that act as a single pool of seamless resources when accessed within data processing environment 100.

Redeployment system 102 operates on a central server, such as server 108, and can be utilized by one or more computers, via an application downloaded from the central server or a third-party application store. Redeployment system 102 may also be a software-based program, downloaded from a central server, such as server 108, and installed on one or more computer. Redeployment system 102 can also be utilized as a software service provided by a third-party cloud service provider (not shown).

Redeployment system 102 (the "system 102") may include a simulator, a model trainer, a model trainer, and a model predictor. The simulator may be a hybrid of a microscopic signal control model and macroscopic delay model with segment-based travel time of vehicles and turning movements at the downstream end of a link. The simulator may be configured to test the effect of the signal control strategy. Moreover, the simulator may test the effect of the signal control strategy locally and/or globally. The model trainer may train or fit a model based on results provided by the simulator. The model updater may update and fit an existing model based on results provided by the simulator. The model predictor may be used to predict an outcome of a model, for example, which intersection to position a roadside sensor.

Figure 13:
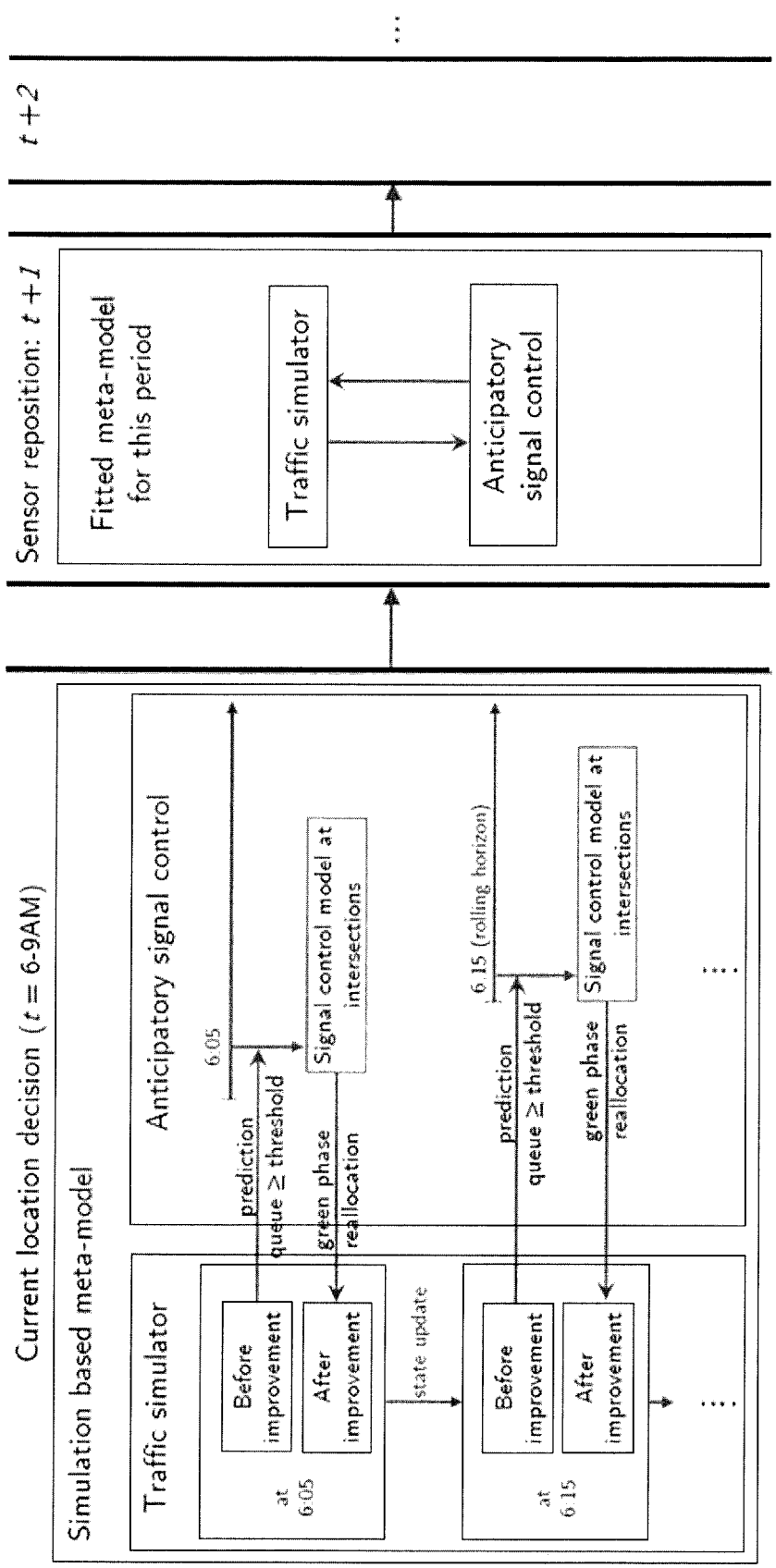
FIG. 13 illustrates a process of sensor deployment.

The system 102 may receive traffic data from one or more roadside sensors. Utilizing the traffic data, the system 102 may detect a queue spillback for an intersection. A queue spillback occurs when a queue from one intersection overflows into another intersection. The detection of a queue is further discussed below. For the cases in which the system 102 does not detect a queue spillback, the system 102 proceeds with normal traffic operations. For the cases in which the system 102 does detect a queue spillback, the system redistributes the green time allocation to different phases in the intersection and/or to other intersections, as discussed herein. The system can optimize the signal controller network via the signal control strategy. To optimize the signal controller network and deploy the sensors for different time stages as illustrated in FIG. 13, the system 102 performs a simulation based signal optimization using the signal control strategy, as discussed herein. The system 102 detects the direction of the phase that is causing the queue spillback, as discussed herein. The system 102 calculates the optimal distribution for the green time for each phase, as discussed herein. The system 102 selects the optimal location for positioning one or more sensors, as discussed herein. The optimal location may be based on expected and/or calculated delay savings, as discussed herein. The one or more sensors may be deployed to the optimal locations and connected to the traffic signal controllers. Having deployed the one or more sensors, the system 102 may distribute the green time allocation to the respective sensor, thereby providing more green time or less green time for the one or more phases, as discussed herein. Thereafter, the system 102 may receive new traffic data via the sensors and repeat the optimization of the signal controller network to deploy the one or more sensors in optimal locations in order to maximize delay savings over one or more time periods.

Computer 122 is a client to server 108 and can be, for example, a desktop computer, a laptop computer, a tablet computer, a personal digital assistant (PDA), a smart phone, a thin client, or any other electronic device or computing system capable of communicating with server 108 through network 106. For example, computer 122 may be a laptop capable of connecting to a network, such as network 106, to send control signals from the system 102 to the traffic signal controller 116 in order to control a traffic light. Computer 122 can represent a virtual instance operating on a computing system utilizing clustered computers and components (e.g., database server computer, application server computers, etc.) that act as a single pool of seamless resources when accessed within data processing environment 100.

Computer 122 can include a user interface (not shown) for providing an end user with the capability to interact with the redeployment system 102. A user interface refers to the information (such as graphic, text, and sound) a program presents to a user and the control sequences the user employs to control the program.

FIGS. 2A and 2B describe the notation, including sets, superscripts, parameters, variables, and functions, discussed herein.

CV market penetration rate in a test-bed city (e.g., Burlington, Vt.) may be high enough to correctly estimate the occurrence of queues, and the problem of where to control signal by locating sensors in Section III. Queue detection may be based on the penetration rate that influences the likelihood of the CV, such as CV 112, being the last vehicle in the queue. The effect of different penetration rates on delay savings is discussed in Section N.

The model is applied in discrete time stages of operations. For example, based on data from the Chittenden County Regional Planning Commission, a 24-hour day is divided into multiple time stages, with distinctively different traffic patterns and different demand across 12:00 to 6:00 A.M., 6:00 to 9:00 A.M., 9:00 A.M. to 4:00 P.M., 4:00 to 7:00 P.M., and 7:00 P.M. to 12:00 A.M. Updated real-time traffic data from the roadside sensors is sent to the simulation model. For the cases in which, the transportation authority believes that the signal control is not appropriate, the system 102 can make another round of decisions based on the model with updated demand distributions.

I.a. Simulation-Driven Signal Control Strategy.

Among several signal control approaches (e.g., reverse offsets), a green time allocation approach may be utilized to maximize the benefit of CV technology. One or more approaches to an intersection may be considered to prevent negative impact of the signal strategy.

Conventional applications related to sensor positioning uses fixed pavement loop detectors to detect the last equipped vehicle in a queue. $\Theta^t$ may be a control policy with loop detectors, and the corresponding network travel time at time period $t \in \mathcal{T}$ can be denoted by $\psi(\Theta^t)$. However, a reduced network travel time $\psi(x^t)$ can be obtained with the signal control strategy utilizing CV technology installed on location vector $x^t$ at time period t. The CV technology may be installed at locations where significant reduction in network travel time is expected. The objective is to maximize the difference between $\Theta^t$ (old) and $x^t$ (new) control strategies. Since network travel times with the old policy $\psi(\Theta)$ are different across time periods $t \in \mathcal{T}$ (i.e., $\psi(\Theta^1) \neq \psi(\Theta^2) \ldots \neq \psi(\Theta^t) \neq \ldots \neq \psi(\Theta^{\mathcal{T}})$), $\psi(x^t)$ cannot be a minimization problem. A delay savings in network travel time, $\psi(x^t)$, may be calculated as $\psi(\Theta^t) - \psi(x^t)$.

A set of candidate locations at x may have queue detection-enabled sensors. This will lead to an optimal location problem with the signal control embedded. The relocation concept may be incorporated into the multi-period stochastic model, and then the sensor location problem may be reformulated into two approximated models.

Each intersection, such as intersection 120 of the transportation network 118, is upstream of all directions, and each link on each direction may have different congestion properties. The formulation of the signal control strategy may be as follows.

Under current signal control using the simulator, queues may reach some portion of the length of a link a. Each intersection i, such as intersection 120a, 120b, 120c, and 120d, has four directional links $a_h$(h=1, 2, 3, 4), such as directional link 124, with the entry flow $u_{a_h}(k)$ at time k. By installing one roadside sensor, such as roadside sensor 114, on an intersection i, the queue can be managed in four directions, especially for a moment that has a queue more than threshold $Y_i$. Each arc has a flow $u_{a_h}^m$ with three directions (left, straight, right) that are assigned to phase m. Once the link $a_{i,1}$ has a queue more than threshold $a_{i,1}^{\bar n}$ during time period $k(\geq \sigma_{a,ih})$ the roadside sensor detects the queue, and an alternative signal control strategy is activated to allocate the green time toward to queued direction. The upstream signal may be modified without any changes in the critical intersection. The queues in four directions are considered in the allocation of green time with the green time allocation weight $Y_{a_{i,h}}$ for link a of intersection i to direction h.

$G_i^{m,min}$ may be the minimum green time, and $G_i^m(k)$ may be the green time for phase m of intersection i at time k. The available green time (lost green time $G_i^2(k)$−minimum $G_i^{2,min}$ may be distributed from the current phase (m=2) to green time $G_i^m(k)$ (m≠2) in other phases (m=1, 3, 4). However, by blocking phase 2, the flow $u_{a_1}^2(k)$, $u_{a_1}^2(k)$, $u_{a_1}^2(k)$ will be in delay. Note that if the arc toward $a_1$ is blocked, traffic flows $u_{a_1}^2$, $u_{a_1}^3$, $u_{a_1}^4$ cannot move. The expected delay savings for one direction $E[\phi_{(i,a1)}]$ is estimated as $$\text{Max } E[\phi_{(i,a1)}] = -G_i^2(u_{(i,a2)}^2 + u_{(i,a3)}^2 + u_{(i,a4)}^2) + G_i^1(u_{(i,a2)}^1 + u_{(i,a4)}^1) + G_i^3(u_{a_3}^3) + G_i^4 (u_{(i,a2)}^2 + u_{(i,a3)}^3 + u_{(i,a4)}^4) + 0 \times (u_{(i,a1)}^2 + u_{(i,a1)}^3 + u_{(i,a1)}^4) \quad \text{(A.1)}$$

where $G_i^2$ is replaced by $G_i^{2,\ min} + G_i^1 + G_i^3 + G_i^4$. Assuming that $G_i^2$ and $G_i^4$ are the critical movements, $G_i^1$ and $G_i^3$ are equal to 0, and Equation (A.1) is simplified. With full directional properties, the expected total delay savings for intersection i may be:

$$E[\phi_{(i)}] = \left\{ \gamma_{(i,a_1)}(G_i^4 - G_i^{2,min}) \sum_{b(b \neq 1)}^{4} (u_{(i,a_b)}^4 - u_{(i,a_b)}^2) + \right. \quad \text{(A.2)}$$

-continued $$\left\{\gamma_{(i,a_3)}\sum_{b\,(b\neq 3)}^{4}\left(u_{(i,a_b)}^4-u_{(i,a_b)}^2\right)\right\}+$$

$$\left\{\gamma_{(i,a_2)}(G_i^2-G_i^{4,min})\sum_{b\,(b\neq 2)}^{4}\left(u_{(i,a_b)}^2-u_{(i,a_b)}^4\right)+\right.$$

$$\left\{\gamma_{(i,a_b)}\sum_{b\,(b\neq 4)}^{4}\left(u_{(i,a_b)}^2-u_{(i,a_b)}^4\right)\right\}$$

All parameters $\phi_i=\{Y_{(i,a_b)}, \sigma_{(i,a_b)}, G_i^m, G_i^{m,min}, u_{(i,a_b)}^m\}$ for delay estimation $E[\phi_{(i)}]$ may be known in advance through simulation. The green time allocation with amount of $G_i^{m4}-G_i^{2,min}$, $G_i^2-G_i^{4,min}$ may cause drivers to change their original route and result in an increase in $u_{(i,a_b)}^4$ or $u_{(i,a_b)}^2$. The phasing and cycle time for each intersection may be given. The procedure may iteratively sets signal timings at each intersection to reduce network delay.

Delay savings estimated for each intersection i are used as input for decision making on a set of optimal sensor locations.

The green time allocation model is a function of vehicle arrival on all approaches to links of an intersection to minimize the negative effect of the signal control strategy. A metamodel may be used to estimate the impact of signal changes in a set of intersections. Different penetration rates associated with delay savings are tested in deciding where to locate sensors. The metamodel may use low-order polynomials (e.g., linear or quadratic), and may be a deterministic function that is much less expensive to evaluate.

The impact of the signal control strategy on the network delay may be approximated by using the metamodel. Different combinations of sensor locations may lead to different delay savings. The signal strategy is triggered whenever the downstream queue is more than a predefined threshold. The computed delay savings are used to update the parameters of the metamodel, which has interaction terms among explanatory variables to capture signal coordination across consecutive intersections. The metamodel is fitted based on a set of simulated observations by the simulator that takes the proposed signal control strategy as an input and the network delay savings as an output. The simulator may model the dynamic route choices of drivers based on simulated time-dependent travel times to achieve traffic equilibrium. The fitted metamodel is used in sensor location problem. The formulation of the metamodel may be as follows.

The parameters of the metamodel are based on the signal control for each intersection i from the formulation of the signal control strategy. In the sensor location problem, the decision variable $x_i$, for locating sensors at intersection i, is used to represent associated expected delay savings $\phi(x_i)$.

The signal influence on a transportation network can be divided by two partitions: the domain $\Omega$ into two subdomains $\Omega^{sr}$ (with sensors) and $\Omega^{nsr}$ (without sensors), and with interface $\Gamma$ such that $\Omega^{sr}\cup\Omega^{nsr}\cup\Gamma$. $\Omega^{sr}$ presents direct effects on controlled intersections with redistributed green times that embed microscopic models, and $\Omega^{sr}$ presents indirect effects on other intersections due to user equilibrium and reduction of green time.

The effects of signal control at $x_{(1)}$ and $x_{(2)}$ on the transportation network delay $\psi$ are not additive. The upstream intersection 1, such as intersection 120a, and downstream intersection 2, such as intersection 120b, each have four directional links. Then dependency structure between the link's upstream and downstream boundary conditions may have interactions. Therefore, the unit contribution of $x_{(1)}$ on $\psi$ is a function of $x_{(2)}$.

The impact of a few intersection signal changes on the whole network may not be high when there is a very high penetration rate. The metamodel may incorporate the indirect influence of $\Omega^{sr}$ on $\Omega^{nsr}$. For simplicity of the stochastic dynamic relocation model introduced in the next section, the complexity of the model may be for example a two-way intersection, in which green phases are more likely to be distributed to a critical direction. $x=[x_1, \ldots x_i]$, $x_i \in N$ may be a selection of sensors for signal controlling purposes. The metamodel may be presented as a generalized linear function by combining individual intersection delay savings and network effects:

$$\psi(x)=\alpha_1\varphi(x_1)+\alpha_2\varphi(x_2)+\ldots+\alpha_i\varphi(x_i)+\in_{(i-1)(i)} \quad (B.1)$$

The partial least squares method is used to find the best coefficients and minimize the sum of squared errors $\Sigma_i \in_{(i-1),(i)}^2$.

$x=x_1,x_2$ may be a set of controls on intersections and other links and intersections $i\in I$ on the network. The simulator may output the total delay as an effect of control $\psi$ ($x=x_1, x_2$). $\psi$ ($x=x_1, x_2$) may be presented as the sum of direct effect $\alpha'_1\times\phi$ ($x_1$), $\alpha'_2\times\phi$ ($x_2$) and indirect effect $\beta_{(1)(2)} \phi$ ($x_1$) $\phi$ ($x_2$); and the modified delay function is as follows:

$$\psi(x=x_1, x_2)=\alpha'_1\times\phi(x_1)+\alpha'_2\times\phi(x_2) \quad (B.2)$$

$$+\sum_{i=3}^{I}\alpha'_1\times\phi(x_i)+\beta_{(1)(2)}\phi(x_1)\phi(x_2)$$

$$+\sum_{i=3}^{I}\beta_{(i-1)(i)}\phi(x_{i-1})\phi(x_i)$$

$$\in_{(1)(2)}+\ldots+\in_{(i-1)(i)},$$

where $\alpha'_1\times\phi(x_1)$ is delay on intersection 1 equivalent to $E[\phi_{(1)}]$ as a direct effect of signal control on intersection 1. The indirect effect $\beta_{(1)(2)} \phi(x_1) \phi(x_2)$ can be expressed as the impact by main control on other intersections i, where $\beta_{(1)(2)}$ is the parameter from intersection 1 and intersection 2 to vicinity of the intersection controller that has sensors installed. With calculated $\alpha_1$ and $\phi(x_1)$ (from simulation run), $\beta_1$ is estimated by subtracting $\alpha'_1\times\phi(x_1)$ from $\phi(x_1)$. The magnitude of $\alpha_i$ and $\beta_i$ present the direct and indirect effects.

For example, intersection 1 may be equipped with the sensor 114 to detect any queue from four direction links. The optimal green time allocation results in 91 seconds of delay savings $\psi$ ($x=x_1$), caused by a direct influence of the signal change. From the simulation result, the simulator 202 outputs a total of 98 seconds of delay savings; then $\alpha_1$, $\beta_1$, and $\in_{(1)}$ may be estimated, in which it can be determined that an indirect influence caused 7 seconds of delay savings. Parameters on delay savings of all possible combination of intersections are considered and fed as an input to the proposed sensor location problem. More examples that present main optimal locations based on different numbers of sensors and optimization technique are illustrated in Section III.b.

$\beta'_{(i-1)(i)}$ may implicitly consider users' route change behaviors. Moreover, the embodiments disclosed herein can be extended to consider the stochastic user equilibrium, which assumes travelers do not have perfect information concerning network attributes and perceive travel costs in different ways.

I.b Anticipatory Dynamic SLP with Flexible Relocations.

A look-ahead model can capture better solutions with anticipatory representation of decisions in the future. A multiperiod stochastic problem may be solved in the framework of the dynamic program, considering the future sensor locations given budget constraints on the sensor costs and relocation costs.

In previous techniques, the deterministic sensor location problem may work for a specific pattern during peak hours (e.g., 6:00 A.M.-9:00 A.M.). However, a single value in the deterministic model may not accommodate the uncertainties in demand, and may overestimate or underestimate the value in a real scenario. If a location is expected to have a below-average queue, then no sensor would be installed as a result of the deterministic strategy. However, because of the variable nature of the traffic flow, there could still be frequent long queues at this location and the lack of sensor at those times could lead to an inefficiency. Inability of the model to handle uncertainty in the future introduced significant weaknesses. To remedy this issue, the stochastic location model developed herein builds on an existing scenario-based stochastic model. This two-stage stochastic SLP with recourse is extended to multiple time periods to use predicted information to make a decision on where to position a sensor. The multiperiod stochastic SLP incorporates uncertainty in delay savings throughout a day, estimated by the signal control strategy.

$G(\mathcal{N}, \mathcal{A})$ may be a stochastic time-dependent network, where $\mathcal{N}$ is a set of nodes i and $\mathcal{A}$ is a set of links a. $x_{(i)}^t$ ($i \in \mathcal{N}$) may be as a binary decision variable equal to 1 if a sensor is located on node i in time period $t \in \mathcal{T}$ and 0 otherwise. $x^t = [x_{(1)}^t, \ldots, x_{(N)}^t]$ may be a particular location vector at node $i \in \mathcal{N}$ at stage t. After actual realization of demand $d \in \mathcal{D}$ in current period $\xi_{(d)}^t$ demand and traffic condition in the future periods $t+1, \ldots, \mathcal{T}$ are predicted to make a more accurate decision, driven by the random process $\xi_{(d)}^{t+1}, \ldots \xi_{(d)}^T$. The expectation of delay savings for a certain period t, $E_{\xi^t}[\psi^t(x^t, \xi^t)]$, is taken with respect to the random vector whose probability distribution is assumed to be known, and a particular realization of demand is denoted by $\xi^t$.

Even though demand variation (DV) for a certain time period is considered, $\xi^t$ changes with demand scenarios at different times of a day $t \in \mathcal{T}$ ($\xi^t = \xi^1, \xi^2, \ldots, \xi^t, \ldots, \xi^{\mathcal{T}}$).

Additional sensors may be required to meet the demand realization occurring sequentially during the time of day. Without increasing the total budget, the configuration of the sensor network on the nodes in each time period may be sequentially changed, thereby solving the multistage stochastic SLP. Although researchers have generally assumed that all sensors are placed at the same time, it is critical to respond to future traffic conditions that evolve over time. Consideration of future relocation decisions in the current location decisions produces significant benefits in the solutions. For example, an occurrence of nonrecurring congestion may change the severity of traffic conditions afterward until the end of the day.

$S^t(x^{t-1}, \xi^t)$ may be the state variable at time period $t \in \mathcal{T}$ that depends on the given sensor locations at t-1 and demand realization at t. Given start of any period t, the state summarizes all past information that is needed for the look-ahead optimization problem. The decision vector $x^{t-1}$ is the action that chooses sensor location vectors at previous period t-1. The dynamic programming problem yields the optimal policy mapping states to actions. $\mu: (x^{t-1}, \xi^t) \rightarrow x^t$, for all possible t and $S^t$.

$y_{(j)(l)}^t (J, l \in \mathcal{N})$ may be a binary variable equal to 1 if there was a relocation from location j at time t 1 to location l at time t+1, and 0 otherwise. A relocation matrix $y^t = [y_{(j)(l)}^1, y_{(j)(l)}^2, \ldots y_{(j)(l)}^t]$ may be introduced from the current location $x_{(j)} \in x^t$ to the next location $x_{(j)} \in x^{t+1}$. The row vector $x^{t+1}$ may be replaced by the row vector $x^t$ and the matrix $y^t$ as $x^t \times y^{t+1} = x^{t+1}$. For example, the problem of relocating a sensor from location (j=1) at t to location (l=2) at t+1 can be expressed as follows:

$$[1\ 0\ 1\ 0\ 1] \times \begin{bmatrix} 0 & 1 & 0 & 0 & 0 \\ 0 & 0 & 0 & 0 & 0 \\ 0 & 0 & 1 & 0 & 0 \\ 0 & 0 & 0 & 0 & 0 \\ 0 & 0 & 0 & 0 & 1 \end{bmatrix} = [0\ 1\ 1\ 0\ 1]$$

The data loss from repositioning sensors depends on the time-dependent travel time matrix: $\pi_{(x^{t-1}),(x^t)}$. The shortest path algorithm is used to find the value $\pi_{(j)(l)}^t \in \pi_{(x^{t-1}),(x^t)}$. Two types of constraints on the sensor location and relocation may be the number of available sensors and the general budget constraint. c may be a maximum number of available sensors. The general budget constraint may be imposed for each time period as well as the total time period. $b_{(1)}^t$ may be the budget allocated for period $t \in \mathcal{T}$ in relocation, which is either spent or carried over to the next period. Denoted by $b_{(2)}^t$, the total relocation budget available at period $t \in \mathcal{T}$. Since each sensor location decision vector has a different relocation cost, relaxing the maximum budget may produce more feasible solutions.

In addition to the advantage of relocation over the stationary model, a more flexible relocation has two additional advantages. First, with other sensors fixed in their locations, relocating one sensor to nearby intersections several times may save relocation cost. Second, with similar benefit, a sensor may move to a location where a significant queue is expected in an earlier stage in a nonpeak hour so that relocation cost is reduced. $b_{(3)}$ may be the relocation frequency for one day operation $\mathcal{T}$. In general, to monitor time-dependent traffic congestions during a day or over the week, more sensors are required than the optimal number. Therefore, more relocations will secure more delay savings. By fixing the maximum frequency and testing feasible numbers, the maximum solution can be obtained faster. A general stochastic sensor location problem may have a bounded number of relocations per time period. For the multiperiod relocations, an additional budget constraint may be included to save relocations for a stage in which more delay savings are expected.

For any realizations of the random elements of $\xi^t$ that become known at stage t, the formulation takes the form of the multiperiod stochastic dynamic programming (MSDP) problem. The multiperiod stochastic SLP with uncertain demand is defined as a dynamic SLP, which is denoted by MSDP1:

$$MSDP1 \quad \max_{\mu} \mathbb{E}_{\xi^1, \xi^2, \ldots, \xi^{\mathcal{T}}} \left[ \sum_{t=1}^{\mathcal{T}} \psi^t(x^t, \xi^t) \right]$$

-continued $$\text{s.t.} \begin{cases} x^1 = \mu(\xi^1); \\ x^t = \mu(x^{t-1}, \xi^t) \quad \forall\, 2 \leq t, t \in \mathcal{T}; \end{cases} \quad (2)$$

$$\sum_{i \in N} x^1 \leq c \,\forall\, t \in \mathcal{T}; \quad (3)$$

$$[y\pi]^t_{(j)(l)} \leq b^t_{(2)} \forall\, t \in \mathcal{T}, \; j = l; \quad (4)$$

$$b^t_{(2)} = b^{t-1}_{(2)} - [y\pi]^t_{(j)(l)} + b^t_{(1)} \forall\, t \in \mathcal{T}; \quad (5)$$

$$x^t_i \leq \sum_{j=1}^N y^{t-1}_{(j)(l)} \forall\, i; \quad (6)$$

$$\sum_t |y|^t = b_{(3)}; \quad (7)$$

$$x^t \in \{0,1\} y^t \in \{0,1\} \,\forall\, t. \quad (8)$$

The objective function represents maximizing the delay savings by installing sensors on optimal locations with feasible relocations. Constraints (2) enforce that the decision vector in the first period may depend on the demand realization, but in later periods, may depend on both past decisions and the demand realization. Constraints (3) ensure that the number of sensors is under budget limit regardless of time. Constraints (4) enforce that no more than the accumulated budget shall be used in sensor deployments, while constraints (5) pass the unused savings to the subsequent stage. Constraints (6) ensure a sensor can be located only when a sensor was relocated in that location in the previous stage. Constraints (7) enforce the total number of relocations in all time periods. Constraints (8) define the decision variables as binary.

$\xi^t \in \xi$ are data vector elements that can be random. The recourse takes the form of $$\psi^t(x^t, \xi^t) = \max_{x^t \in \{0,1\}^{|N|}} \sum_{i, i'=1, i \neq i'}^N \alpha^t_{(i)} \phi\{x^t_{(i)}\} + \beta^t_{(i)(i')} \phi\{x^t_{(i)}\} \phi\{x^t_{(i')}\};$$

the detailed network delay formulation is presented in the formulation of the metamodel.

The complexity of the problem may be resolved by using Lagrangian relaxation and a variable neighbor-hood search algorithm in Section II. Since CV data is expensive, losing some data elements over a few relocations may lower the quality of data collection. The transportation authority may want to obtain the solution faster while losing some delay savings, especially when delay savings are relatively lower because of low penetration rate.

I.c. Anticipatory Dynamic SLP with Restricted Relocations

Until the increase in the penetration rate reaches a certain point, the transportation authority may be reluctant to relocate sensors because the rewards are relatively lower. A partially anticipatory assumption can be obtained by restricting the relocation frequency to once per sensor. In this restricted look-ahead problem setting, once one sensor is relocated, no more relocations can occur for that sensor. The formulation is simplified by assuming that there is no linkage between demand realizations and location decisions between some time periods. The independence assumption enables the multistage stochastic program to be rewritten as a large two-stage stochastic program. This assumption greatly reduces the complexity of the problem, which has the benefit of allowing the transportation authority to solve much larger and more realistic instances.

A new auxiliary variable, $z^t_{(i)}$, may be equal to 1 if node i has a new sensor installed, −1 if a sensor at node i is relocated to another location, and 0 if there is no relocation. The vector difference of location is expressed as the sum of relocation variables $y^t_{(j)(l)}(j, l \in \mathcal{N})$ that is equal to 1 if there is a relocation from location j at time t to location l at time t+1:

$$\sum_j y^t_{(j)(i)} - \sum_l y^t_{(i)(l)} = z^t_{(i)} \forall\, i \in \mathcal{N}, \forall\, t \in \mathcal{T}. \quad (9)$$

In some aspects, sensor removals cannot occur when $z^t_{(i)}=-1$, and a sensor cannot be installed at a location with an existing sensor when $z^t_{(i)}=1$. z may be a decision vector; and a sequence of $z^t_{(i)}$ for all time periods $t \in \mathcal{T}$ can be defined as $[z^t_{(i)}, \ldots, z^{\mathcal{T}}_{(i)}]$. The frequency of $z=\{-1, 1\}$ is restricted to less than once for given operation period $\mathcal{T}$ as follows:

$$|z=-1,1| \leq 1 \;\forall i \in \mathcal{N} \quad (10).$$

The relocation associated constraints may be replaced and presented with the multiperiod dynamic SLP with restricted relocation, which is denoted by MSDP2:

$$MSDP2 \;\; \max_{\mu} \mathbb{E}_{\xi^1, \xi^2, \ldots, \xi^{\mathcal{T}}} \left[ \sum_{t=1}^{\mathcal{T}} \psi^t(x^t, \xi^t) \right]$$

$$\text{s.t.} \begin{cases} x^1 = \mu(\xi^1); \\ x^t = \mu(x^{t-1}, \xi^t) \quad \forall\, 2 \leq t, t \in \mathcal{T}; \end{cases} \quad (11)$$

$$\sum_{i \in N} x^1 \leq c \,\forall\, t \in \mathcal{T}; \quad (12)$$

$$[y\pi]^t_{(j)(l)} \leq b^t_{(2)} \forall\, t \in \mathcal{T}, \; j = l; \quad (13)$$

$$b^t_{(2)} = b^{t-1}_{(2)} - [y\pi]^t_{(j)(l)} + b^t_{(1)} \forall\, t \in \mathcal{T}; \quad (14)$$

$$x^t_i \leq \sum_{j=1}^N y^{t-1}_{(j)(l)} \forall\, i; \quad (15)$$

$$|z = -1, 1| \leq 1 \forall\, i \in \mathcal{N}; \quad (16)$$

$$x^t \in \{0,1\} y^t \in \{0,1\} \,\forall\, t. \quad (17)$$

The objective function represents maximizing the delay savings by installing sensors at optimal locations with restricted relocations. Constraints (11)-(15) and (17) are equivalent to MSDP1, while constraint (16) ensures that once a sensor has been used in relocation in the past and current periods, that same sensor cannot be relocated in the future.

MSDP2 is further simplified with one-stage look-ahead with the restriction property on sensor relocation. By doing so, the computational burden in dynamic programming can be significantly reduced. The first stage (t=1) and later stages (t=2, ..., $\mathcal{T}$) can be dependent, but the later stages (the second to the last stage problems) can be solved independently of each other. For the cases in which at most one sensor can be relocated makes the decisions in the periods t+1, ..., $\mathcal{T}$ nonanticipatory. Here the nonanticipatory conditions $x_{(2)}, \ldots, x_{(t)}$ state that the second-stage decision depends only on the scenario that will prevail in the first stage. The first (t=1) and the second to the last stage (t=2, ..., $\mathcal{T}$) problems can be solved independently of each other. The objective function in MSDP1 can be replaced as follows.

Suppose that demand realizations $\xi^t$ are independent from $\xi^{t-1}$. Here the nonanticipatory conditions $x^2_{(2)}, \ldots x^N_{(t)}$ state that the second-stage decision should not depend on the scenario that will prevail in the later stage. The multiperiod dynamic SLP MSDP2 is reformulated as a two-stage stochastic program, which is denoted by MSDP2':

$$MSDP2' \quad \max_{\mu} \mathbb{E}_{\xi^1,\xi^2,\ldots,\xi^{\mathcal{T}}} \left[ \sum_{t=1}^{\mathcal{T}} \psi^t(x^t, \xi^t) \right]$$

$$\text{s.t.} \begin{cases} x^1 = \mu(\xi^1); \\ x^t = \mu(x^1, \xi^t) \quad \forall\, 2 \le t, t \in \mathcal{T}; \end{cases} \tag{18}$$

s.t. (12), (13), (14), (15), (16), (17).

The decision $x^1$ with $\xi^1$ is dependent on the future realization of uncertain demand $\xi^2, \xi^3, \ldots, \xi^t$. With restricted relocation, $\xi^2, \xi^3, \ldots, \xi^t$ are independent of each other. It implicitly accounts for the decision that $x^2$ is independent of the future realization of uncertain demand $\xi^3, \xi^4, \ldots, \xi^t$. Therefore, the decision $x^2$ is contingent on the outcome of random vector $\xi^2$, but is unique for all random parameters that are realized in the future, $\xi^3, \xi^4, \ldots, \xi^t$. Because of this independence, the conditional expectations from MSDP2 can be omitted. Constraint (18) is deterministic that depends on $\xi$ only through the decision of x. There is no constraints linking realization of random demands $\xi$ for different time periods t∈$\mathcal{T}$. Since the value of $\psi$ depends only on $x^2, b^2_2$ at t=2, $x^2$ ($x^1, b^1_2, \xi^1$) will be equal to $\psi(x^2, b^2_2, \xi^2)$.

In the previous formulation, the locations of all sensors are decided in all time periods at the beginning of the planning horizon. Some studies found correlations between morning and evening commute distance and time, and evening commute as the mirror image of the morning commute. However, the morning and evening commutes can be independent because of different schedule preferences. User equilibrium, for the evening commuters seeking to minimize the cost of their trip, must be a pattern of bottleneck arrivals and departures that allows no commuter to reduce his or her own cost by choosing another arrival position at the bottleneck. In this disclosure, correlations between morning rush hour demand and the rest of the day are considered through an optimal relocation policy for each scenario based on conditional probability and expected delay savings.

I.d. Multiperiod Stochastic SLP.

In this section, a baseline model is proposed and compared to relocation models of the disclosure herein. In this myopic problem setting, sensors are fixed in their optimal locations throughout the day without moving to other better locations in different time periods. The fact that the sensor location decision at time t=1 is identical to that at t=2, ..., $\mathcal{T}$ is equivalent to the same decision vectors $x^1 = x^2 =, \ldots, =x^{\mathcal{T}}$. This property makes the model nonanticipatory. Having an identical set of x for all periods makes multistage stochastic programming, MSP, a stationary model. The solution needs to be compromised to incorporate the scenario from t=1 to t=$\mathcal{T}$ into one decision vector x. While constraint (18) is further simplified to $x=\mu(\xi)$, relocation constraints (12)-(17) are not used in MSP. Assuming demand realizations in different periods $\xi=\xi^1, \xi^2, \ldots, \xi^{\mathcal{T}}$ $\xi$, the maximization terms can be brought outside the expectations and a formulation equivalent to MSP may be presented as:

$$MSP^{max}_{\mu} \mathbb{E}_{\xi^1,\xi^2,\ldots,\xi^{\mathcal{T}}} \left[ \sum_{t=1}^{T} \psi^t(x, \xi^t) \right]$$

s.t. $x = \mu(\xi);$ (19)

$$\sum_{i \in N} x \le c\, \forall\, t \in \mathcal{T};$$ (20)

$x \in \{0, 1\}\, \forall\, t.$ (21)

The objective function represents maximizing the delay savings by installing sensors on optimal locations identical across different time periods without relocations. Constraints (19) ensure the stationary sensor location vector depends on demand realization in each period. Constraints (20) enforce the maximum number of available sensors. Constraints (21) ensure a binary decision variable.

I.e. Rolling Horizon Procedure.

t'-time-step anticipatory dynamic models with relocations are presented. To make a sensor location decision in the current period, the horizon is rolled forward one time period. On this rolling horizon procedure, decisions over the planning horizon $t^1=t, \ldots, \mathcal{T}$ and the decisions we make at time periods t+1, ..., $\mathcal{T}$ are for the purpose of making a better decision at time t. At time t (in state $S^t$), the problem can be solved optimally over the horizon from t to t+$\mathcal{T}$. $\psi(x^t, \xi^t)$ may be the minimum delay earned from implementing decision $x^t$. After an implementation of the best decision on MSDP1, the process is repeated by optimizing over the interval t+1 to t+$\mathcal{T}$+1. The solution of the old policy $\mu(x^t, \xi^{t+1})$ is replaced with the new policy $x^{(t+1)'}$. The new state $S^{(t+1)'}$ will have updated relocation time matrices following the shortest path $\pi^{(t+1)'}$ and the resulting delay savings $\psi(x^{(t+1)'}, \xi^{(t+1)'})$. This real-time process can be conducted by repeatedly using MSDP1.

In the longer period, one backup sensor may be needed for sensor failure, an unpredicted traffic crash, or a weather event.

I.f. Source of Errors.

The market penetration rate of CVs plays a significant role for detecting queues, as less accurate sampling leads to lower delay savings. Compared to traditional queue detection (e.g., loop detectors), which takes longer, the models disclosed herein provide for quicker queue detection for signal control when using connected vehicle RSE for. As market penetration rate increases, queue detection at signalized intersections will improve. Moreover, the models disclosed herein do not have the issue of latency or reliability of messages passing through roadside DSRC.

II. Solution Method.

To solve large instances of the dynamic sensor location problem, the solution efficiency may be enhanced through decomposition, via a tight Lagrangian bound and an efficient dual heuristic with an embedded a search heuristic.

II.a. Nonsubmodularity in Dynamic SLP.

In location problems, numerous studies have used monotone submodular functions. The greedy algorithm provides a good approximation to the optimal solution of the NP-hard optimization problem. However, the submodularity, the property that exhibits a natural diminishing returns property cannot be applied in the sensor location problem discussed herein. The submodular property is assumed to not exist because of the interaction effect of nearby signals and dynamic relocation of sensors at different times of a day. The sensor location problem is solved with a different number of sensors as the constraint, assuming diminishing marginal delay savings. As shown in Section III, even with a reduced number of sensors, fair delay savings are guaranteed under feasible relocations. After reaching the maximum efficiency of the relocation, the level of diminishing marginal delay savings may become identical to that in a model without relocation.

The signal control strategy may have less negative impact by locating another sensor in the nearby intersection. This coordination effect of sensors does not preserve the submodular property in the SLP. The marginal gain from two to three sensors may be higher than the gain from one to two sensors because of high interactions between the third sensor and other sensors. The submodular property does not hold on SLP. For example, in defining C.1., a set function $f: 2^X \in \mathbb{R}$ is a function assigning a real value to every sensor location subset $x \subseteq X$ of a given ground set X. A finite ground set $x = [x_1, x_2, \ldots x_i]$. In defining C.2., a set function $f$ is nonnegative if for every $x \subseteq X$ we have $f(x) \geq 0$. In defining C.3., a set function $f$ is normalized if $f(\Theta) = 0$.

Using these definitions, a counterexample of the submodular property in the sensor location problem is presented. To investigate the consequence of changes in the location i=1 on the network delay savings, the first derivative is determined to obtain the marginal effect as a composite coefficient estimate: $\beta_{(1)(2)} \phi(x_2) + \alpha_1$. The first-order interaction model is formalized with a submodular property. φ may be the best solution with c sensors as a subset of Π, and v may be the best solution with c+1 sensors as a subset of Y.

Regarding the theorem C.1., given a set function f, a sensor location set $x \subseteq X$, and an element $x \in X$, the marginal contribution of x to x with respect to f is defined as $$f_x(x) = f(x \cup \{x\}) - f(x)$$

V may be a finite set for $\forall \varphi \subset v \subset V$. The following function cannot be satisfied, and the function is nonsubmodular:

$$f(\varphi) + f(v) \geq f(\varphi \cap v) + f(\varphi \cup v) \quad \text{(C.1)}$$

Counterexample: Order the sensor locations in decreasing order of their solutions: $[x_1, x_2, x_3, \ldots x_i]$ and $[\alpha_1 > \alpha_2 > \alpha_3 > \ldots > \alpha_i]$. We start with one sensor at $x_1$. By adding one sensor $x_2$ to the network, the marginal delay savings are $\beta_{(1)(2)} + \alpha_2$ as a function of $f(\varphi)$. In the next step, adding one more sensor $x_3$ produces marginal delay savings of $\beta_{(1)(3)} + \beta_{(2)(3)} + \alpha_3$ as a function of $f(v)$. In the peak hours, when several consecutive intersections are congested, $\beta_{(1)(3)} + \beta_{(2)(3)} + \alpha_3$ are expected to be higher than $\beta_{(1)(2)}$. Therefore, when this counter effect satisfies, the marginal effect of one additional sensor does not always present diminishing return, and the submodular modularity does not exist:

$$\beta_{(1)(3)} + \beta_{(2)(3)} + \alpha_3 \geq \beta_{(1)(2)} + \alpha_2 \quad \text{(C.2)}$$

A higher sensor cost results in the deployment of fewer sensors, each sensor being relocated more frequently. The labor fee, data loss, and transportation cost of relocation may not be higher than the sensor cost. The benefit of relocation is more when there are fewer sensors.

The MSDP1 and MSDP2 with relocation make the problem more complicated, and the myopic greedy algorithm cannot efficiently solve complex combinatorial optimization problems. However, even though there is no submodularity, the effect of relocation on the diminishing return is presented (Section III). With a reasonable relocation cost, a few sensors can have good performance in maximizing delay savings for the whole network. The increase in delay savings diminishes as an additional sensor is added. There is an exception that when relocation expense is more than highway administrations can afford to pay, instead of relocating sensors, additional sensor deployment is more economical. However, with the help of emerging sensor technology and automation, relocation cost will go down as time passes.

Lagrangian relaxation is introduced in the next section to solve the SLP with the submodular function.

II.c. Lagrangian Relaxation.

The search space is decomposed to two subproblems: a location problem and a relocation problem. Feasible solutions for each time period t are connected by relocation.

Trying to solve this problem over a horizon may lead to an explosion of problem size and curse of dimensionality. The explosive exponential complexity of the search space precludes the use of commercial solvers. For fair comparison between different sensor deployment concepts, the heuristics are tested and focused on benefits of flexible relocations. This is a combinatorial optimization problem because the optimal location of sensors is chosen among candidate locations for each uncertain demand realization in multiple stages. The size of the state space typically grows exponentially in the number of policies considered, which depends on previous decisions.

Figure 3A:
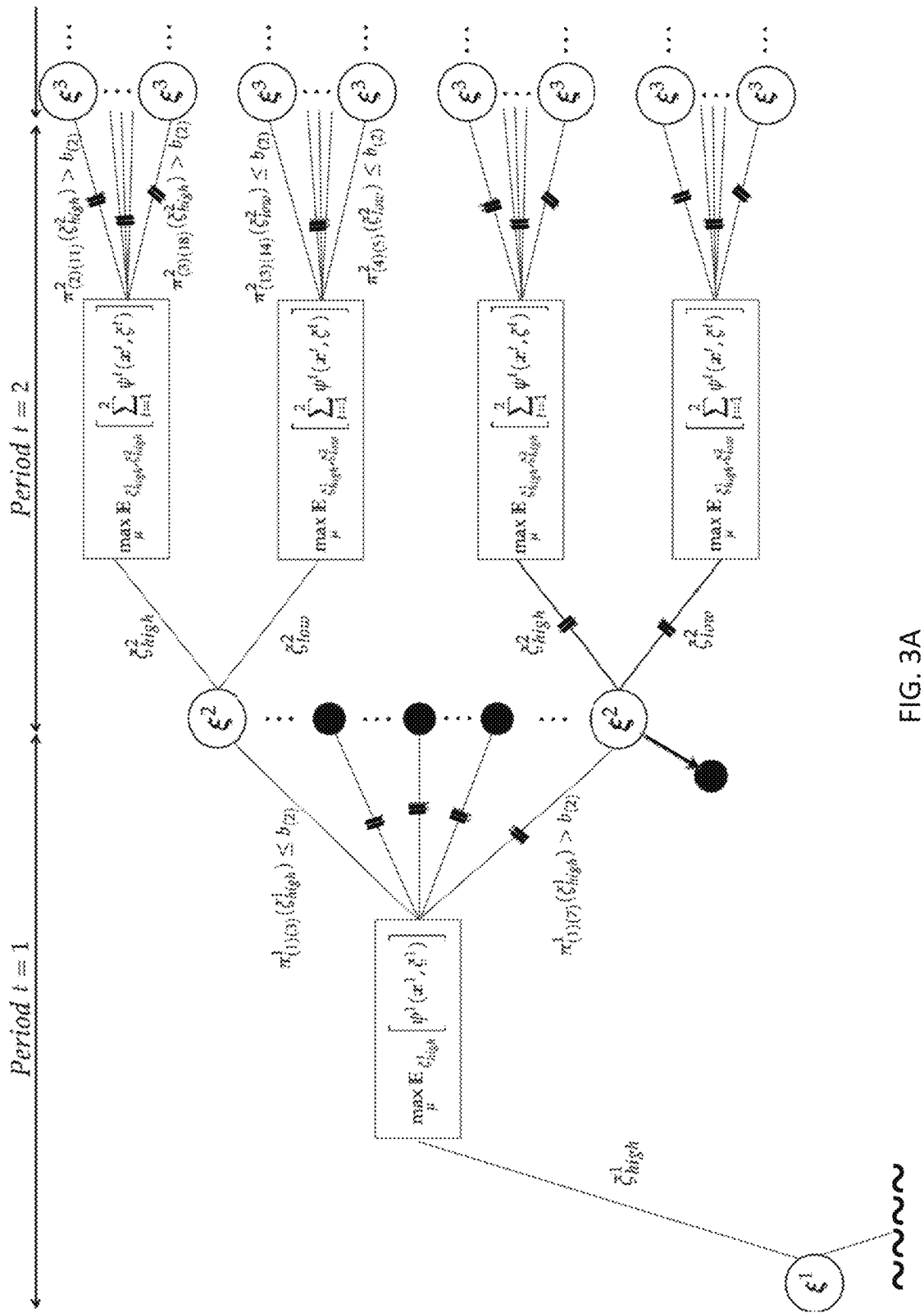
FIGS. 3A-3B illustrates a decision tree structure.
Figure 3B:
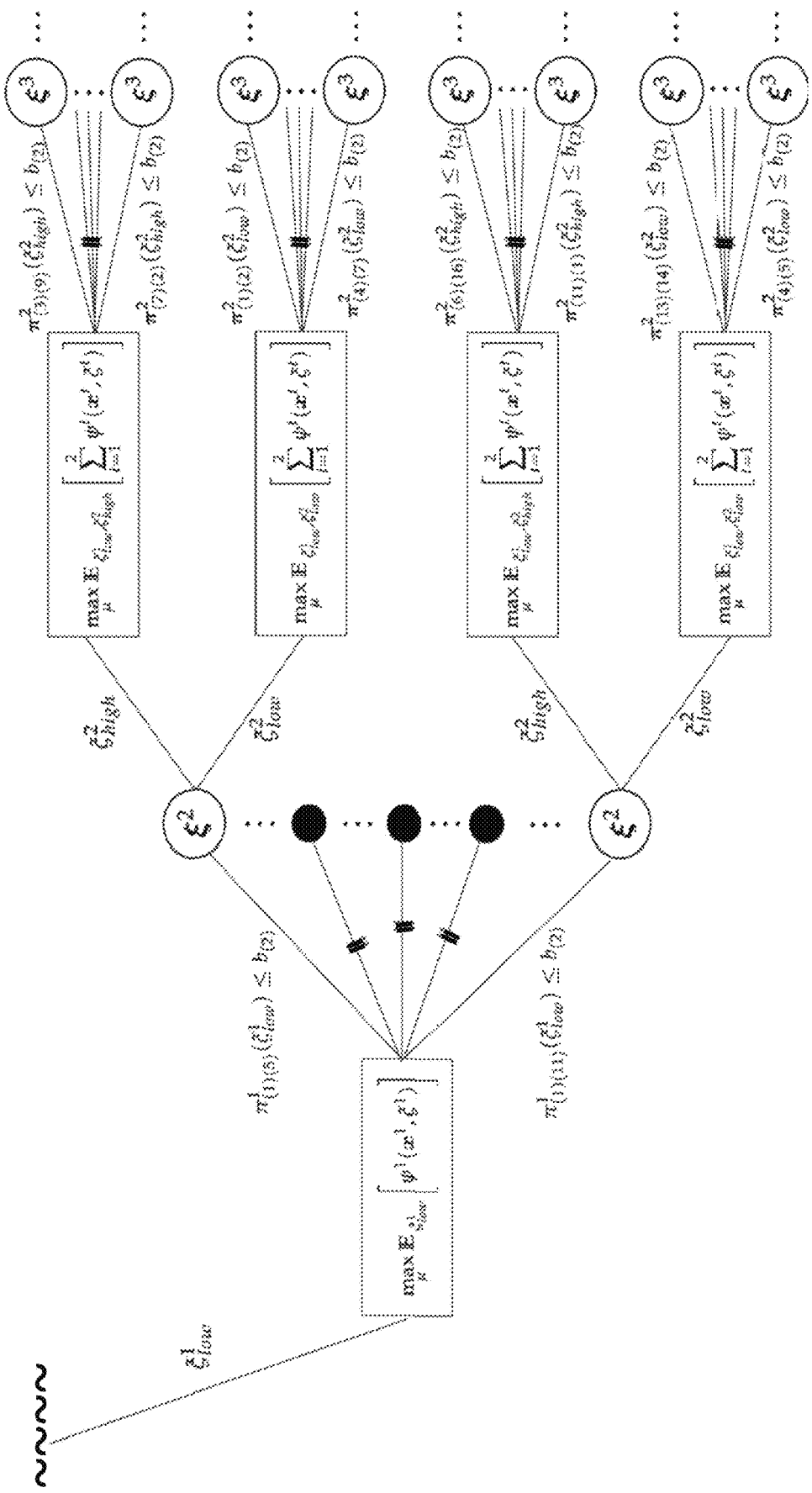

As shown in FIGS. 3A-3B, as the number of periods increases toward the end of the day, the scenario tree grows exponentially, making it very challenging to optimize. The travel time between stages, $\pi_{(j)(l)}^{t+1}$ represent relocation costs at period t+1. A node with black circle presents infeasible solutions that do not have to be considered in the search space. Therefore, by solving the relocation problem with constraints associates with relocation cost, future location changes at t+1, ..., $\mathcal{T}$ are fixed in a reduced search space. A discretization of the decision space is introduced by an iterative process. First, the relocation problem is solved to provide initial solutions with feasible links between optimal locations in each time period. Second, by fixing feasible links on the tree, the problem is simplified to find a reduced set of locations with some fixed locations defined by future relocations.

Applying a relaxation guided variable neighborhood search to the reduced problem instances yields significantly better solutions in shorter times than applying these metaheuristics to the original instances. The Lagrangian relaxation is introduced to separate the problem into two. The cutting plane algorithm is introduced to solve the Lagrangian dual problem, and thereafter, the heuristic is searched.

The dynamic sensor location problem in MSDP1 and MSDP2 exhibits a special structure that is suitable for Lagrangian relaxation. The nonnegative Lagrangian variables may be associated with $\lambda^t_{(j)(l)}$ constraints, and the Lagrangian relaxation may be applied.

The resulting Lagrangian problem is as follows:

$$L(\lambda) = {}^{max}_{\mu} E_{\xi^1,\xi^2,\ldots,\xi^T}\left[\sum_{t=1}^{T} \psi^t(x, \xi^t)\right] + \sum_{j,l \in N} \lambda^t_{(j)(l)}[y^{t-1}_{(j)(l)} - x^t] \quad (22)$$

s.t. (2), (3), (4), (5), (6), (7), (8).

Note that $x^t$ is contained only in constraint (3). This allows the aforementioned problem to be separated into two subproblems. The first subproblem is given as $$L(\lambda) = \max \sum_{j,l \in N} \lambda^t_{(j)(l)} y^{t-1}_{(j)(l)} \quad (23)$$

s.t. (4), (5), (6), (7).

The second subproblem is defined as $$L_2(\lambda) = {}^{max}_{\mu} E_{\xi^1,\xi^2,\ldots,\xi^T}\left[\sum_{t=1}^{T} \psi^t(x, \xi^t)\right] - \sum_{j,l \in N} \lambda^t_{(j)(l)} x^{t-1} \quad (24)$$

s.t. (2), (3), (8).

From the relations discussed previously, $$L(\lambda) = L_1(\lambda) + L_2(\lambda) \quad (25)$$

and it is noted that $L(\lambda)$ yields a upper bound to the original problem, assuming that $\lambda \geq 0$.

The decomposition of $L(\lambda)$ offers significant computational advantages over the original formulation. We calculate $L_1(\lambda)$ by solving solely the relocation problem. We calculate $L_2(\lambda)$ by scenarios only with the first stage influencing the rest of the stages. Denote by $x^\Lambda$ future relocations defined. The left term of $L_2(\lambda)$ can be replaced by $$\sum_{t=1}^{T} E_{\xi^1,\xi^2,\ldots,\xi^T}[\psi^t(x^\Lambda, \xi^t)]$$

with fixed relocations.

Since we find an upper bound for each value of $\lambda$, as long it is nonnegative, we want to find the value of $\lambda$ that leads to the tightest upper bound. We define this as Lagrangian dual problem as $\min_{\lambda \geq 0} L(\lambda)$. By calculating the optimal solutions of two subproblems $\bar{x}_h^t$ and $\bar{y}_j^t$, we can solve $L_1(\lambda)$ and $L_2(\lambda)$. A subgradient of $L(\lambda)$ is expresses as follows:

$$\delta_i^t(\lambda) = \bar{y}_j^t - \bar{x}_j^t \text{ for } i=j \quad (26)$$

II.d. Cutting Plane Algorithm.

A subgradient algorithm may be enhanced with valid cuts and a dual heuristic. The system 102 starts the subgradient algorithm by fixing the value of the Lagrangian variables k and solves for the primal variable vectors x and y. The Lagrangian variables are updated based on the violation of the relaxed constraints. The system 102 stops the algorithm when a maximum number of iterations is reached (as shown in FIG. 4).

$\bar{y}$ may be a solution of the first subproblem $(L_1(\lambda))$, and $\bar{R}$ may be the set of vertices such that $\bar{y}_j=1$. The set $\bar{R}$ gives a feasible location of repositioned sensors; in an optimal solution, either $$\sum_t |y|^t = b_{(3)} \text{ or } \sum_t |y|^t = b_{(3)} - 1.$$

As presented, either $\bar{y}$ is optimal or $$\sum_t^T |y|^t = b_{(3)} - 1$$

provides a valid cut to the problem. With the second subproblem $(L_2(\lambda))$ unchanged, the cut affects $L_1(\lambda)$. With the $L_1(\lambda)$ fixed associated with b(3) locations, $L_2(\lambda)$ is equal to MSP.

In FIG. 4, the cut $$\sum_t^T |y|^t = b_{(3)}$$

divides the solution space into two subregions at any iteration. In the first subregion, the constraint $$\sum_t^T |y|^t = b_{(3)}$$

is enforced. The associated objective value $$\sum_{t=1}^{T} E_{\xi^1,\xi^2,\ldots,\xi^T}[\psi^t(x^\Lambda, \xi^t)]$$

is equal to the lower bound Lbd calculated by the dual heuristic. In the second subregion, the cut states that at most $b_{(3)}$ of the relocations in solution y* can be used at a time. The two subregions are disjointed, and their union is the feasible region of MSDP1. In subsequent iterations, either the lower bound is updated or the system 102 stops the algorithm. If the lower bound is updated, a better feasible solution is found. In this case, the cut is updated accordingly. Otherwise, the system 102 stops the algorithm with an upper bound Ubd. This upper bound is not valid for the original problem MSDP1, but rather on its restriction defined on the subregion defined by the best feasible solution found. Hence, the upper bound Ubd can be more than the lower bound Lbd. If Ubd≤Lbd, the best feasible solution y* is optimal to MSDP1. This is true since the optimal objective value on the second subregion is less than or equal to Lbd. Hence, Lbd cannot be improved. If Ubd≤Lbd, then Ubd is at most 500×(Ubd−Lbd)/Ubd from the optimal objective value of MSDP1.

When the lower bound is improved, it is possible to add the new cut instead of replacing the existing one. However, adding multiple cuts makes the second subproblem difficult to solve. Integrating valid cuts within a subgradient algorithm leads to a new cutting plane algorithm. The system 102 uses the cutting plane algorithm to calculate both an upper bound and a lower bound and generate a feasible solution. The gap between the bounds can be used as a stopping criterion. This overcomes one of the weaknesses of subgradient optimization, which is the stopping criterion. The system 102 stops the algorithm when the bound does not improve for 500 iterations.

Given a solution $\bar{y}$ of $L_1(\lambda)$ with feasible relocations at t+1, ..., $\mathcal{T}$, a stable and reduced location decision of MSP is solved with variable neighbor search, in the next section.

II.e. Variable Neighborhood Search.

To remedy the slow convergence issue, a variable neighborhood search (VNS) is employed, which is a metaheuristic based on transformations of solutions that determine one neighborhood structure on the solution space. In VNS, a perturbation to the current neighborhood operator at a local minimum enables the search to reach a solution that could not have been reached by the current local search mechanism. It yields a broader exploration of the search space by visiting several high-quality local optima in the same CPU time.

A VNS structure uses a finite set of preselected neighborhood structures denoted by $\Xi_\omega$. As illustrated in FIG. 5, the system 102 begins with (1) an initialization that selects the set of neighborhood structures $\Xi_\omega$, for $\omega=1, \ldots, \omega_{max}$ used in the shaking phase, the set of neighborhood structures $\Xi_v$ for $v=1, \ldots, v_{max}$ used in the local search, and a stopping condition. In the (2) shaking step, the incumbent solution is perturbed. The system 102 generates a solution $\tilde{x}'$ at random from $\omega$th neighborhood $\Xi_\omega$ of $\tilde{x}=(\tilde{x}_1, \ldots, \tilde{x}_i)$. It takes sensor location to be inserted at random, if it satisfies DelaySavings $(\tilde{x}'))>$DelaySavings $(\tilde{x})$, and finds location to be deleted at random. In the (3) local search step, the system 102 uses the algorithm to explore the neighborhood to find the best neighbor $\tilde{x}''$ of $(\tilde{x}')$ in $\Xi_v(\tilde{x}')$. In the (4) move or not step, if the local optimum $\tilde{x}''$ is better than the incumbent, move there $(\tilde{x}\leftarrow\tilde{x}'')$ and continue the search with $\Xi_\omega$ $(\omega\leftarrow 1)$; otherwise, set $\omega\leftarrow\omega+1$. The steps of a basic VNS structure are defined as in the Algorithm 2 as shown in FIG. 5.

III. Case Study.

This section addresses a sensor location problem applied in downtown Burlington, Vt., where spatial congestion patterns at different times of day vary. The network setup is explained in the Section III.a., and the proposed models are applied in Section III.b.

III.a. Network Description.

The case study uses a calibrated traffic simulation model of Burlington, Vt. The simulator of the system 102 replicates sensor installation based on an anticipatory signal control model.

Figure 6A:
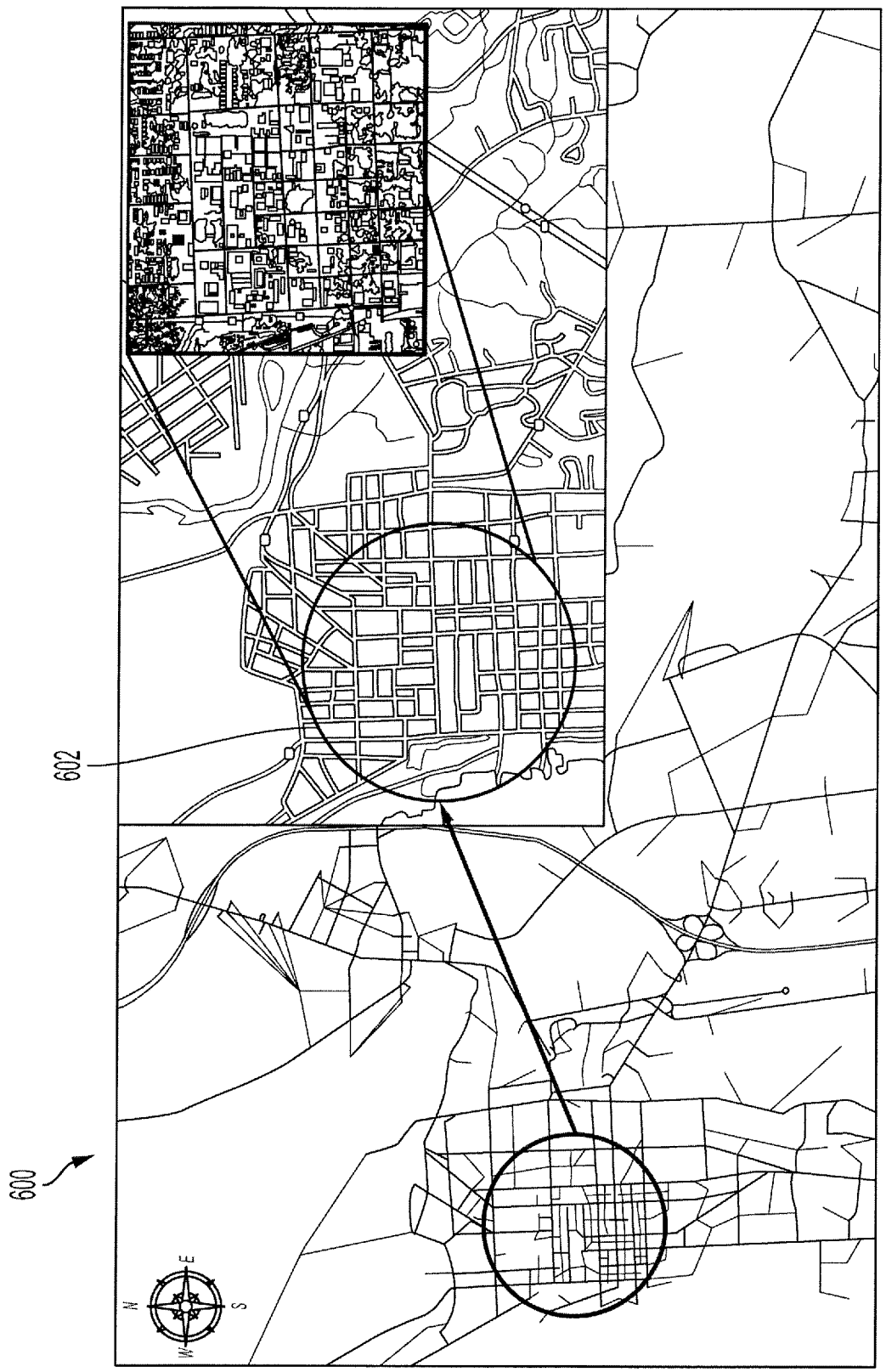
FIG. 6A illustrates a map of a road network.
Figure 6B:
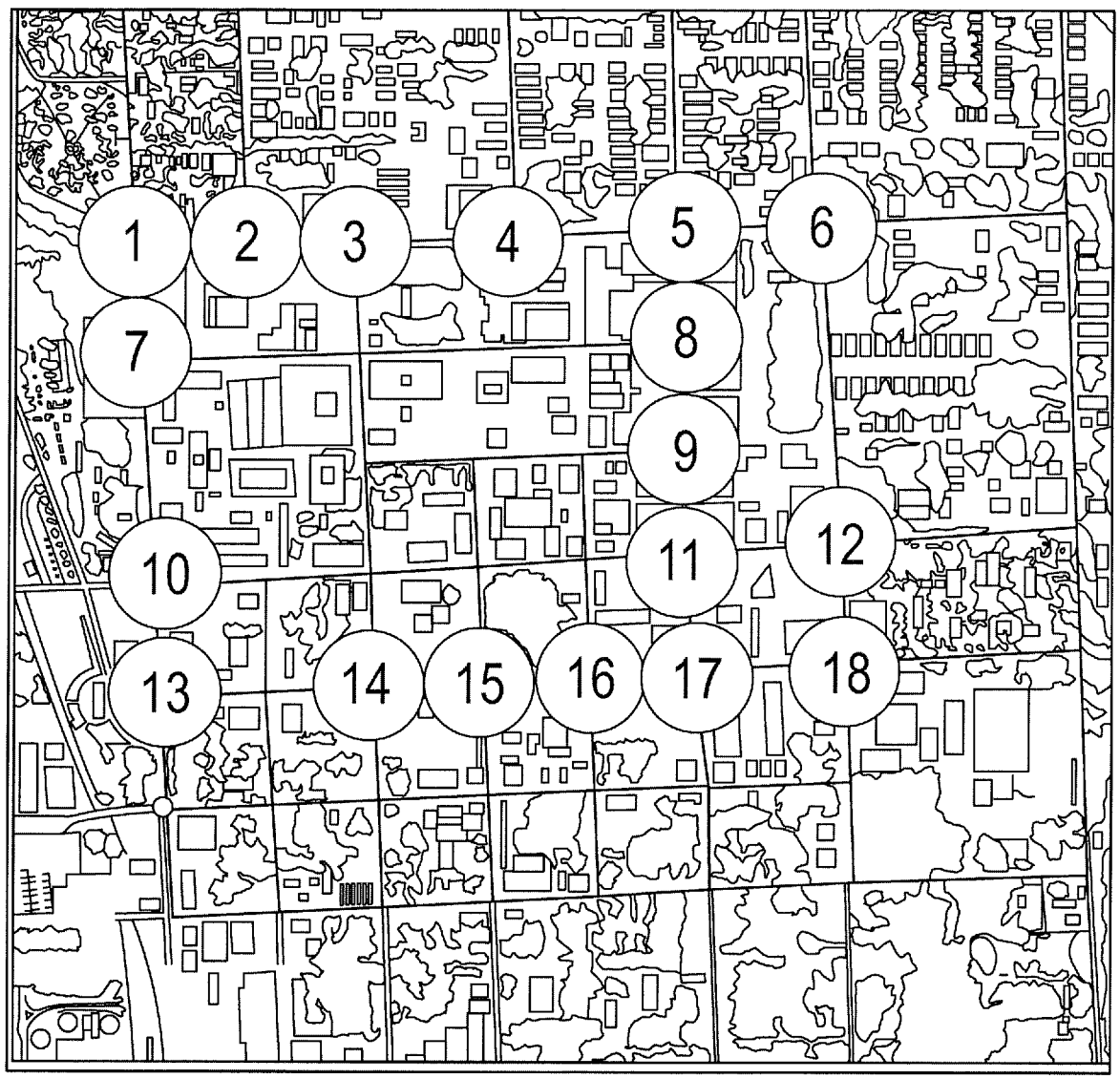
FIG. 6B illustrates locations in the subnetwork of the road network.

FIG. 6A is a map 600 of the Burlington road network. A subnetwork 602 located in the city center is delimited by a circle, where the congestion is highest during peak hours. The network contains 71 links and 37 intersections, 19 of which are signalized candidate locations to install sensors and control the traffic flow. There are a total of 70 phases with a cycle time of 90 or 120 seconds. FIG. 6B illustrates locations 1, 2, 3, 4, 5, 6, 7, 8, 9, 10, 11, 12, 13, 14, 15, 16, 17, and 18 in the road subnetwork 602. It is noted that the locations illustrated in FIG. 6B correspond to the locations in FIGS. 7A-10B, and for purposes of clarity, the location reference elements are not illustrated in FIGS. 8A-10B, rather FIG. 6B is used to reference these locations.

The traffic simulation model was calibrated to match time-dependent traffic count and speed data observed in the field. A set of signalized intersections in the City of Burlington's downtown network were controlled considering temporal and spatial variations in demand scenarios. Demand arises at the nine centroids nearest to these intersections. Under the rolling horizon scheme, indirect impact of the proposed control (user's routing change) is random and realized after the simulation run. The simulation setup consists of 10 replications of each period, preceded by a 15 minute warmup time. To obtain lane-specific distributions from road-specific distribution, the flow data (i.e., external outflow, turning flow, external inflow) is disaggregated. Within this time period, congestion gradually increases. The average flow of the roads in the subnetwork steadily decreases and the average density increases. The dynamic OD matrix is used to generate trips, along with a headway model. Time-varying OD trip matrices and congested dynamic network travel times are estimated.

Real-world data from field traffic counts, intersection turning movements (i.e., through, left turn, and right turn), origin-destination routing, and current traffic signal phase information was obtained from the transportation data management system of the Chittenden County Regional Planning Commission (CCRPC; Vermont Agency of Transportation 2016). The calibrated version of the Chittenden County Metropolitan Planning Organization TransCAD model is integrated into simulator of the system 102 based on calibration of trip generation, trip distribution, mode choice, and vehicle assignment steps verified against the National Household Travel Survey and 2040 Metropolitan Transportation Plan.

Morning commutes were generally more consistent than evening commutes, with most people arriving at work between 7:00 A.M. and 9:00 A.M. Nearly a third of the participants felt it was possible to work from home occasionally, but not on a consistent basis. Traffic flow was substantially higher in the southbound direction during the morning peak hours, and higher in the northbound direction during the afternoon. For example, the southbound morning peak movement (1,217 vehicles/hour) was 3.3 times higher than northbound movement (365 vehicles/hour), and northbound afternoon peak movement (951 vehicles/hour) was 1.7 times higher than southbound movement (549 vehicles/hour) in the west part of the map in FIG. 6, where Battery St. and Pearl St. intersect. The traffic volume patterns during the morning and afternoon commute peak hours present significant locational differences that justify a sensor relocation policy in Burlington.

For each sensor deployment strategy, the optimal signal plan was derived on a set of intersections. The simulation model of the system 102 was used to estimate the parameters with the signal control effect on the subnetwork. The objective was to maximize the expected delay savings associated with signal control over the three periods (|T|=3) for different numbers of sensors. This is a suitable short horizon that was chosen to capture important behaviors. Two demand scenarios $\xi$ are considered: high and low demand. Entry demands were 1.5 times ($\xi_{high}$ demand scenario) and 0.75 times ($\xi_{low}$ demand scenario) of the original demand for the first, second, and third 15-minute intervals, and equal to the original demand for the last 15-minute interval.

A threshold for the end of a queue was determined through simulation for the different signal control strategies that were tested. For different interactions, the queue length threshold $\theta$ ranges from 0.6 to 0.9. The next section presents how the dynamic location approach derives signal plans that perform significantly better than the Burlington plan for some problematic intersections.

III.b. Results.

Peak hours are spaced one period apart, corresponding to the congestion pattern of the time of day. The performances of difference sensor location strategies, MSP, MSDP1, and MSDP2, are tested and compared. The signal strategy changes according to the delay improvement, with different levels of penetration rate presented. Lagrangian relaxation and the VNS algorithm solve the dynamic sensor location problem in a reasonable time.

III.b.1. Anticipatory Dynamic SLP with Relocations.

The test for the proposed multiperiod stochastic sensor location models is discussed herein. MSDP1 has a budget c to implement two to nine sensors with different maximum relocation frequencies.

The most similar demand profiles are clustered into stages. In this study, three main stages (morning peak hours, nonpeak hours, and afternoon peak hours) are used to find the effectiveness of sensor relocation. Optimal three-period deployment plans for different numbers of installed sensors c, the corresponding delay savings, and computation times are presented in FIG. 7A. The magnitude of relaxation can be adjusted for the effectiveness of sensor relocation based on the dependency between intervals, considering relocation expense and computational efficiency. The deployment plans for c=2, 3, 4, 5, 6, 7 are illustrated in FIGS. 8A-8B, while a similar illustration for c=8, 9 is provided in FIG. 9A.

The metamodel coefficients consist of the direct control strategy on signalized intersections derived by the formulation of the signal control strategy for green time allocation and the indirect influence on nearby links and intersections estimated by simulation using the metamodel. The proportion of the indirect effect of signal control on the whole network ranges from 2.1% to 16.5% of total impact on the delay savings. To be more specific, total delay savings (872 s) is subtracted from the direct effect of control (890 s) to calculate the indirect effect of control (18 s), 2.1% of total delay savings with two available sensors. This is reasonable because it takes time for users to learn a new system. More advantageous users may change their routines by switching to different routes and explore new systems. On the contrary, more conservative users may stick to their routines because they are reluctant to explore new systems. As time goes by after the onset of the new signal system, the proportion of users switching to different routes will increase. The optimal timing of changing the system optimum considering the learning rate of users can be based on iteration of a bilevel combinatorial optimization that may significantly increase the computational time.

FIG. 7A presents the nonexisting submodular property with the diminishing return effects, only after the number of sensors reaches c=3. The increase in the delay savings by having more flexible relocation diminishes when we have more sensors. Compared to limited relocation in FIG. 7C, more delay savings are observed for all numbers of sensors in FIG. 7A. Unsurprisingly, when the budget for the number of sensors is relatively large (e.g., c=5), there is less need to relocate sensors. Maximized delay savings using a small number of sensors c=2, 3, 4 is equivalent to having more sensors. Since intersections with higher delay savings will have a priority, adding one more sensor will have less gain in delay savings:

$$\Delta(x'|[x_{14},x_{15},x_{16}]) \geq \Delta(x'|[x_{13},x_{14},x_{15},x_{16}]).$$

In this example, the marginal benefit provided by placing a sensor, given deployed sensors at locations $[x_{14}, x_{15}, x_{16}]$ in the road network 602 does not increase as one more sensor $[x_{13}]$ is deployed.

More relocation is given to improve the solution of MSDP1 with c sensors in each scenario. Note that decisions made at time period t=3 are for the purpose of making a better decision at time t. Location decisions are projected over this horizon in order to know where to position sensors currently in order to position sensors in the.

Third, different spatial congestion patterns at different times of day are presented on the network 600. Demand and queue tend to follow a daily rush-hour pattern; queue grows during the morning peak hours and then disappears. The significant morning peak and afternoon peak traffic influence the delay savings. Therefore, it is beneficial to install sensors at places where delay savings can be maximized: at locations $[x_{14}, x_{15}, x_{16}]$ during the morning peak and with relocation to locations $[x_8, x_9, x_{11}]$ during the afternoon nonpeak. The installed sensors at two consecutive intersection help to maximize the delay savings. The spatial congestion patterns are in line with the consideration of spatial correlation of different road segments in the sensor location problem.

Fourth, information loss (relocation cost) around noon tends to be lowest. This is due to the temporal congestion patterns at different times of day. It is better to flexibly move sensors without extra relocation cost during nonpeak hours. Instead of saving the relocation budget for future periods, with a similar benefit, a sensor may move to a location where a significant queue is expected at an earlier stage during nonpeak hours so that relocation cost can be reduced. For example, consider the c=3 sensor deployment in Table 3. The optimal solution suggests relocation of all sensors at locations $[x_8, x_9, x_{11}]$ at t=2 is equal to the plan at t=3. There is no sensor relocation at t=3 to avoid an infeasible link with extra high relocation cost due to congestion. Problem MSDP1 facilitates relocations from earlier periods and captures the most intense delay savings and coordination of two consecutive intersections to maximize the delay savings.

The previous solution shows the advantage of flexible relocation of sensors explicitly relying on the direct representation of decisions in the future predicted information. Having more than four sensors increases the computational efficiency, because we need find a feasible solution without increasing the relocation frequency.

The approximated solution in the next section presents a better computational efficiency with losing some rewards that we might have earned from flexible relocation.

III.b.2. Anticipatory Dynamic SLP with Restricted Relocations and Nonanticipatory SLP.

The proposed MSP and MSDP2 are tested. We directly compare the delay saving changes without sensor relocation (FIG. 7B) and with limited sensor relocation (FIG. 7C). FIG. 7B presents MSDP2 with the relocation frequency limited to once. By reducing the complex dynamic problem MSDP1 to a two-stage stochastic problem, the approximate solution of MSDP2 reduces the computational time by least 20.99% to at most 38.87%. The best solution gap to the best known values of MSDP2 represents some loss of reward in delay savings. The gap between the solution of MSDP1 and approximate solution of MSDP2 ranges from 2.68% to 25.69%. Having more than six sensors has a less than 10% gap.

The sensor relocation between time periods improves the solution with complexity. As a result, the computational time of MSDP1 is in general at least three times longer than that of MSP (FIG. 7C). Interestingly, this stationary model has an average gap of 22.32%, close to highest gap of MSDP2. Therefore, the approximate relocation model can achieve both computational efficiency and less quality loss in solutions by capturing complex interactions taking place within our optimization of the future. In practice, with an enough budget for the sensor deployment, transportation authority personnel may prefer a policy from MSDP2, which has an average 32.18% in computational savings compared to MSDP1.

Figure 10A:
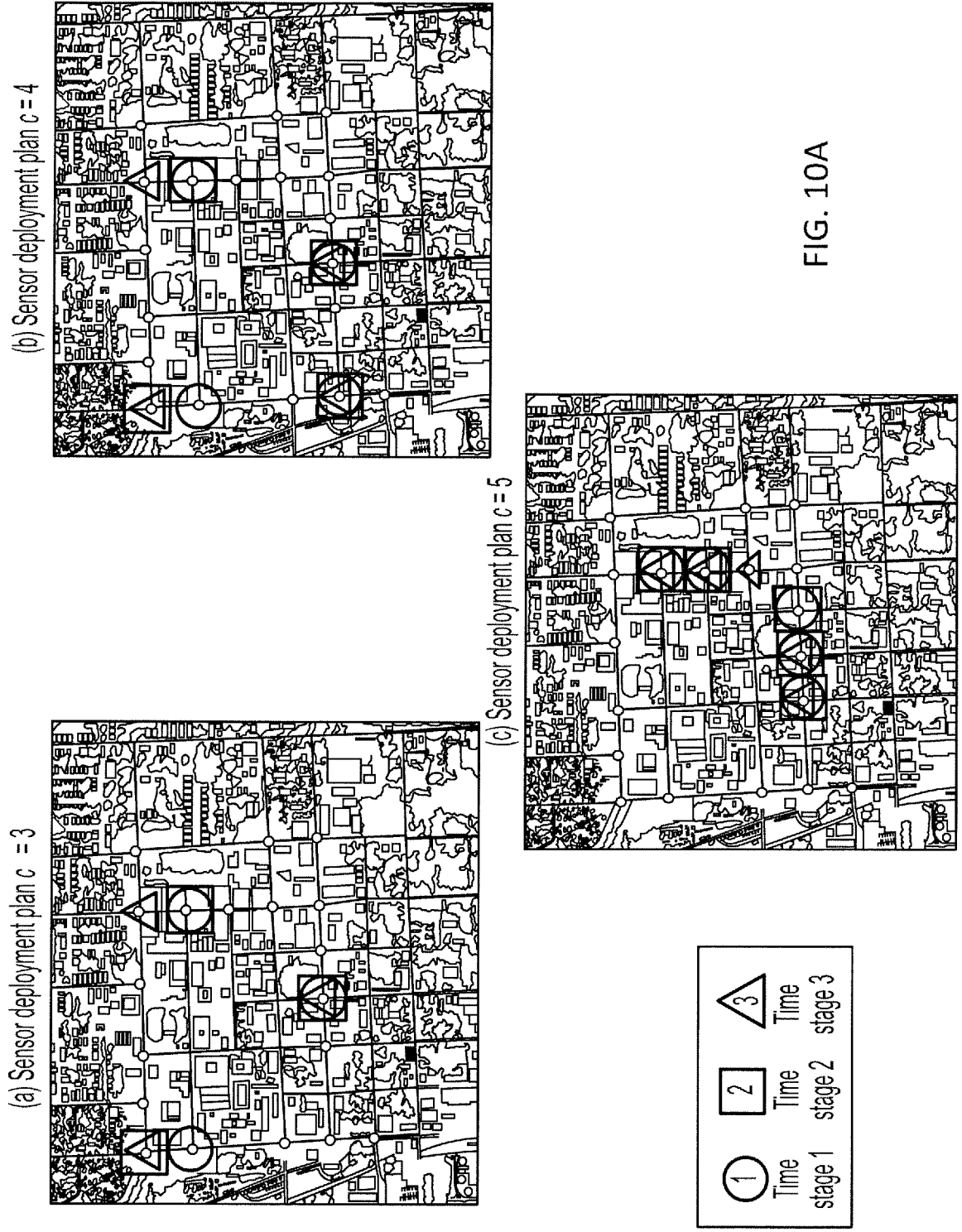

In MSP, because more sensors are installed at the beginning, more delay savings are expected with the same sensor installation cost. Problem MSP presents diminishing return in delay savings with additional sensors from c=2 to c=4 and from c=5 to c=9. Problem MSDP2 presents a one-time-period look-ahead policy by explicitly optimizing with an approximation of future information. As shown in FIG. 7C, in MSDP2, making a decision at time t=1 considering future relocations at time t=2 and time t=3 produces more benefit than MSP. FIGS. 10A-10B illustrates the effect of relocation in SLP application with number of sensor c=2, 3, 4, 5, 6, 7. A similar description for c=8, 9 is provided in FIG. 9B.

As expected, instead of the fixed solution at locations $[x_7, x_8, x_{15}]$, the flexible solution with relocations at locations $[x_1, x_8, x_{15}]$ and locations $[x_7, x_5, x_{15}]$ present higher delay savings (FIG. 7C). With sensor number c=4, relocation enables sensors to be located in optimal locations during the peak hours. There is a steep increase in delay savings with sensor number c=5, 6 that has an equivalent effect of having more sensors.

Relocation increases the level of diminishing returns in the delay savings by having higher delay savings with sensor number c=4, 5, 6. After c=7, a steep level of diminishing returns is presented. With a limited number of sensors, a good relocation policy can have reasonable delay savings. For instance, installing 8 sensors with relocation is equivalent to installing 10 sensors without relocation.

By adding an additional sensor, the relocation increases the gain on delay savings from having coordinated signal control. The interaction terms capture the coordination across consecutive intersections. If this strategy is applied only at a single link and there is not sufficient queue storage capacity at upstream links, the queue problem could transfer to another part of the network, causing long queues at intersections located further upstream. By deploying sensors at two consecutive intersections, queues are stored on longer links and do not cause intersection blockages at other parts of the network. In fact, most of the time, the green phases in Equation (A.2) are allocated to another critical phase instead of being evenly distributed to all directions. This property shows that the two-way interaction in the metamodel properly reflects network delay savings.

The ratio of the difference between the best known optimal solution and approximate solution divided by best known optimal solution was consistent (average, 1.03%; standard deviation; 1.11%) and varied between 0% to 4.72% over a variety of instances from two to nine sensors. Given the combinatorial optimization problem, the size of the instance being solved increases exponentially. The VNS method systematically changes the neighborhood structures within the search to avoid local optima.

Figure 11:
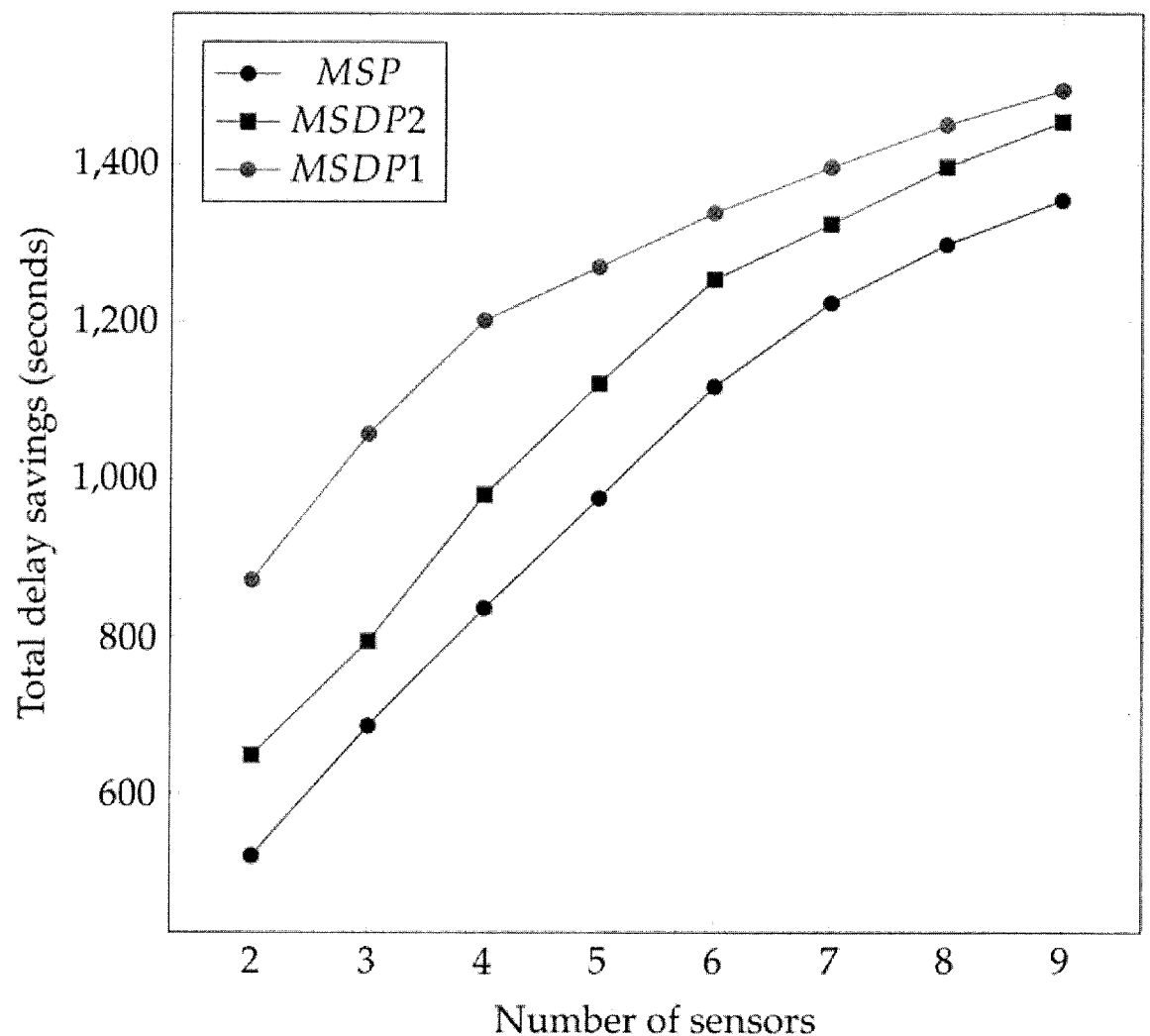
FIG. 11 illustrates different levels of diminishing return in delay savings.

There is a submodular property in MSP when the number of sensors used increases from c=2 to c=9. Dynamic models break the assumption of the submodular property by accelerating delay savings with sensor relocations. FIG. 11 presents different levels of diminishing return in delay savings. With flexible relocations, MSDP1 presents the highest rate of delay savings with smaller sensor numbers c=2, 3, 4, to save the budget of the transportation authority. The largest delay savings (1,494 s, c=9), 17.3% of total network delay, is achieved with MSDP1. With four available sensors (c=4), 14.5% of total delay is saved with MSDP2, compared to 15.5% with MSDP1 and 12.9% with MSP. With limited relocations, MSDP2 presents the highest rate of delay savings with sensor numbers c=4, 5, 6 and diminishing return in delay savings.

IV. Application.

In this study, three stages of a look-ahead model with relocation were explored. To expand the sensor location model over a five-day period, there are two potential strategies. First, a look-ahead policy that extends one day is enough to produce high-quality decisions. We can then simulate our policy to produce forecasts of congestion over all five days. Second, we can solve the multistage problem for daily operation today, and after observing all the outcomes of random variables, reoptimize the decision and run it again tomorrow.

IV.a. Penetration Rates.

Figure 12:
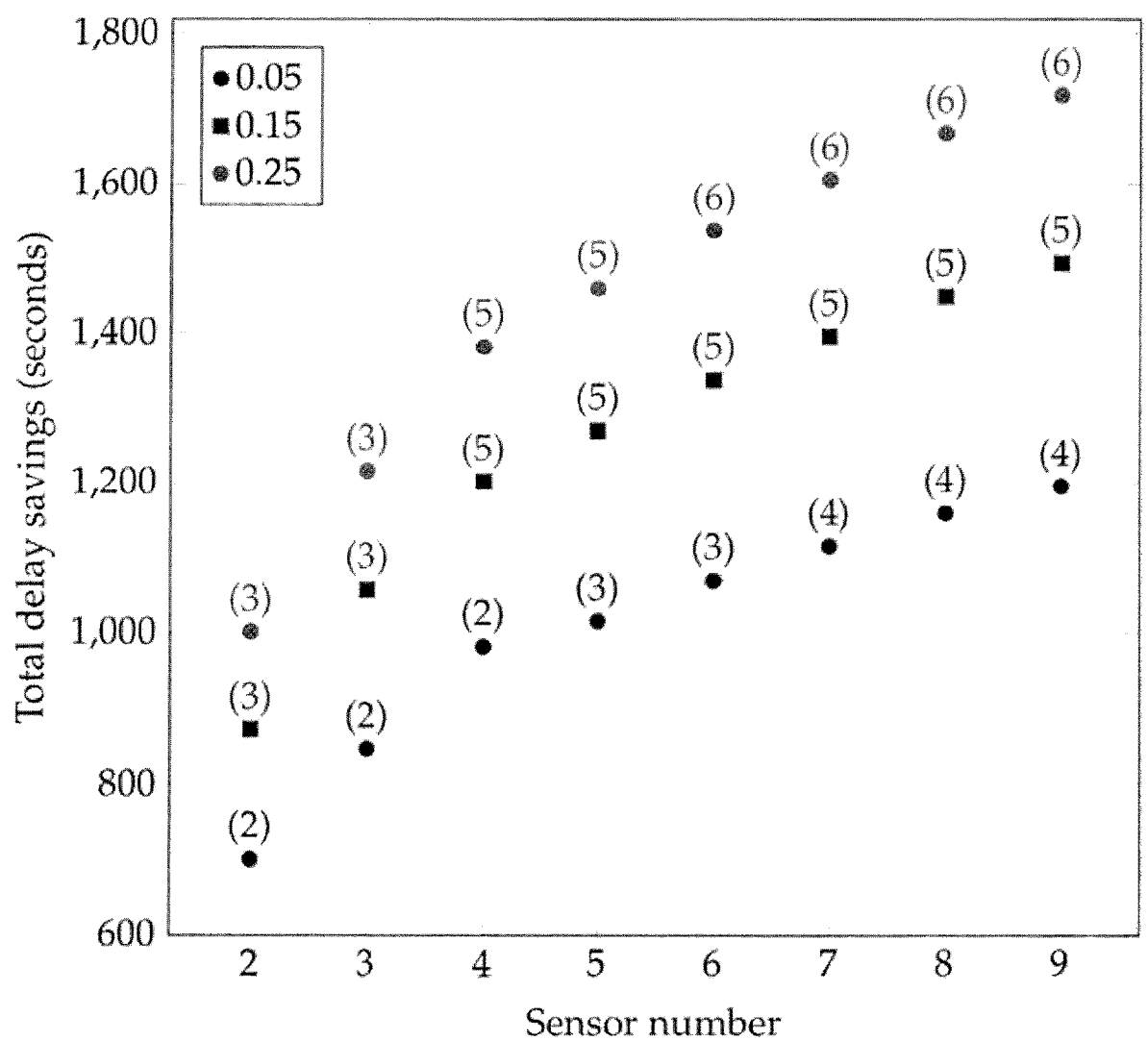
FIG. 12 illustrates the performance of the model with three level of penetration rates.

The models disclosed herein have the benefits of installing sensors in congestion. Oversaturated traffic conditions require relatively lower penetration rates for accurate estimation of speed (p=0.05) or delay calculation (p=0.15). According to current low penetration rates of CV technology on most transportation infrastructures, the model's performance at three levels of penetration rate (p=0.05, 0.15, 0.25) for the same demand scenarios, as illustrated in FIG. 12. Accurate queue detection may require an appropriate portion of CV technology-equipped vehicles among other traffic. Based on the results, a 15% penetration rate of CV technology-equipped vehicles presents the steepest gradient when one more sensor is added into the network. A 5% penetration rate presents the lowest increase in total delay savings with an additional sensor. The delay savings from a penetration increase from 5% to 15% is, on average, 1.5 times higher than that from a penetration increase from 15% to 25%.

The numbers in parentheses in FIG. 12 show the sum of all movements (relocation frequency) in each stage. As the penetration rate increases, there is more chance to reduce delay and more chance to relocate sensors. This is due to the trade-off between relocation cost and delay saving benefits. As the penetration rate decreases, relocation frequency limited without guaranteed benefit with labor cost.

The average total delay for different numbers of sensors (i.e., n=2, . . . , 9) with lower penetration rates (p=0.05) with less delay savings was 1.4 times the average delay with penetration rate p=0.15, and that with higher penetration rates (p=0.25) with more delay savings was 0.6 times the average delay with penetration rate p=0.15. With low rates (p=0.05, 0.1), the transportation authority can trigger the signal less frequently, and after some time period, frequent signal trigger. Based on the empirical observations, a transportation authority can use the proposed method at different levels of market penetration rate.

Compared to previous studies, the signal control model disclosed herein takes account of all approaches to intersection vehicle departures. Therefore, this approach prevents the case in which network delay increases because of negative influence on a critical direction when two directions are served by the same phase.

IV.b. Demand Profile.

The system 102 may run the model every day considering within-day variability. The system 102 may also run the model further than one day considering day-to-day variability. The everyday model may update traffic information from the previous day to have a more accurate simulation with a precise solution for a specific scenario, and may take advantage of having a nonanticipatory constraint. The day-to-day variability may update traffic information with more approximation to the future stages and computational time. The day-to-day variability may require an anticipation with longer look-ahead stages beyond the rest of the day, without a nonanticipatory constraint. In addition, the last location of one day is conserved for the next day in calculating the optimal relocation frequency. For example, when within-day variability for a specific day is not beneficial enough, there is no relocation for that day. However, if day-to-day variability for a week is beneficial, there will be relocation, and vice versa.

The following discusses comparing two different DV scenarios composed of temporal and spatial variation using OD matrix in a specific time stage with total four available sensors. In the three-stage setting, $DV^t_{12}$ may be the changes of each cell (tetotal number of ODs) in the OD matrix from the morning peak (stage 1) to the nonpeak (stage 2), and $DV_{23}$ may be the changes from nonpeak (stage 2) to the afternoon peak (stage 3). Each cell in the OD matrix represents within-day variation measurement $DV^t_{13} = DV^t_{12} + DV^t_{23}$. When there is a temporal variation only (without spatial variation) between stages, $DV^t_{13} DV^t_{13}$ is uniformly distributed. When there are both temporal and spatial variations, the distribution of $DV^t_{13}$ is more deviated from the center.

In time-dependent OD matrices, compared to the existing demand profile, the daily demands are explored to be less stochastic (similar demand) and more stochastic (very different demand) in different time stages. In the time-dependent OD table, two parameters (time variation and spatial variation) are used as main factors. With different demand for flexible relocations during three periods of a day (morning peak and afternoon nonpeak and peak), the performance of sensor relocation is evaluated.

The difference in each cell in the OD matrix from the first to the last stage, $DV^t_{13}$, generates a different level of variation: standard deviations of $DV^t_{13}$ for different OD pairs t. With the variation less than 20%, there was a minimal increase in total delay savings. The optimal deployment plan in FIG. 7A has a medium demand distribution with standard deviation $\sigma_{DV_{13}}=2.3$. For more a deterministic demand distribution with average $\sigma_{DV_{13}}=0.1$ between different numbers of sensors, the overall relocation frequency decreased. Total delay savings were 854 s for two sensors, which is a 2.1% decrease due to deterministic demand distribution; 1,027 s (2.9%) for three sensors; 1,146 s (4.7%) for four sensors; 1,209 s (4.8%) for five sensors; 1,284 s (4.0%) for six sensors; 1,352 s (3.2%) for seven sensors; 1,412 s (2.6%) for eight sensors; and 1,473 s (1.4%) for nine sensors. When there is a temporal variation only (without spatial variation) between stages or there is a uniform growth factor to increase or decrease overall traffic volume in each cell of the OD matrix, the traffic control may operate well on both real-time measurements and historical distributions.

For $\sigma_{DV_{13}}=4.6$ between different numbers of sensors, total delay savings were 887 s for two sensors, which is a 1.7% increase due to stochastic demand distribution; 1,084 s (2.5%) for three sensors; 1,245 s (3.6%) for four sensors; 1,308 s (3.0%) for five sensors; 1,375 s (2.8%) for six sensors; 1,424 s (1.9%) for seven sensors; 1,466 s (1.1%) for eight sensors; and 1,507 s (0.9%) for nine sensors. The results of the total delay savings are based on highway capacity that is not easily altered, however, sensor relocations can be adjusted in response to the dramatic changes in traffic demand.

By knowing the demand profile, transportation agencies can adjust budgets for deployment based on a feasible relocation frequency to maximize the travel time delay savings. The true benefit of the relocation comes from real-time collected CV data that can explain traffic dynamics compared to historically collected empirical demand distributions.

IV.c. Deployment Feasibility.

The disclosure discusses one or more aspects related to initial sensor locations considering potential sensor relocations. If relocation is not feasible, then there is no relocation. The sensor relocation problem may be closely related to variations of within-day demand, day-to-day demand, and marker penetration rate.

According to Intelligent Work Zone Deployments conducted by the Iowa Department of Transportation, the labor cost of sensor relocation is $480. The installation cost includes initialization and setting up new equipment, and it costs up to $2,500.

Once new equipment is set up, the sensors may be relocated with minor tunings but not major reconfigurations. Considering the sensor cost by the equipment itself ($10,000) and maintenance cost ($3,000) every year, the total cost of six fixed sensors with a life cycle of five years is $165,000. On the contrary, two portable sensors with an average 9 relocations every month for five years is $158,686.

As the specialization of labor increases, the productivity increases. As a return in economy scale, the average cost decreases. If the benefit is not enough, there is no relocation. Since labor fees may be high, an accurate model is needed to justify sensor relocation. In addition to network delay savings, other key potential benefits of the disclosure to increase the feasibility of relocation relate to value of time, environmental sustainability impact (e.g., $CO_2$ reduction), energy savings, and safety for each vehicle on the network.

In one or more additional aspects, the roadside sensors may be a portable traffic signal. A portable traffic signal may take 10 minutes to transform from trailer to operating position. Such application can be quickly and easily transported and deployed offering the ability to enable the motoring public to experience a minimum of delays, and wireless operation between nonconnected portable signal trailers.

Moreover, periodic retiming of traffic signals has been shown to yield road-user benefits that typically exceed the cost of the retiming by as much as a 40 to 1 ratio. Because of changes in travel demand patterns over time, the signal timing plan may be periodically updated to maintain intersection safety and efficiency. Calibration intervals can be adjusted more or fewer times based on actual deployment compared to the simulation optimization model. More frequent calibration can be required with higher uncertainties in demand and lower penetration rates of CV technology-equipped vehicles to compensate for accurate queue detection and guaranteed delay savings. Vehicle-to-infrastructure applications have been improved, and various applications of temporary deployment of portable sensors have already been implemented in many urban cities for purposes such as reduced speed work zone warnings, speed zone warnings, emergency communications and evacuation, approach lane use management, CV technology-enabled turning movement, emissions analysis, hazmat monitoring and response, probe-based traffic monitoring, and pavement maintenance shipment. The optimization approach discussed herein offers the ability to help transportation agencies achieve minimum delays in a variety of work zones. The sensor relocation can be applied to portable traffic signal equipment to minimize delays and increase work zone safety with controlled costs and improved profitability.

Additionally, human labor is expensive to repetitively schedule and synchronize sensor relocations. To reduce costs and the time to schedule sensor relocations, synchronously commanding robots, drones, and autonomous vehicles can be utilized to schedule and synchronize sensor relocations. For example, unmanned aerial vehicles (UAVs) can be a CV sensor by delivering from the previous location to the next location.

The embodiments discussed herein provide an efficient solution to urban traffic congestion, via the dynamic relocation of sensors to improve network delay by controlling traffic signals under demand uncertainty. The proposed methodology combining CV technology with simulations can be applied to any sensor location problem handled with portable devices. Lagrangian relaxation and the cutting plane method add a valid cut with a better bound, and the second subproblem, is solved faster with a variable neighborhood search method. Among three multiperiod stochastic models, the look-ahead policy provides the maximum benefit, and accelerated diminishing delays with additional sensors. With limited budget, the traffic operation may achieve maximum benefit by having more relocations. The model can be applied repeatedly in each stage in a rolling horizon.

In one or more additional aspects, onboard DSRC units of the vehicles may be utilized as portable sensors. The onboard DSRC units may utilize vehicle-to-vehicle communication for increased congestion coverage length and message broadcast range. In doing so, the system would remain portable with, a requirement of only one roadside DSRC unit at the sight of the congestion area, which would engage all vehicles carrying onboard DSRC units to participate in traffic data acquisition and transportation of useful traffic safety information back to travelers.

In one or more additional aspects, two bilevel optimizations can be used in the dynamic sensor location problem with relocation. First, signal control can be solved in the lower level against sensor location in the upper level. Second, flows can be adjusted to a new user equilibrium and the process repeated until both flows are at equilibrium and signal timings are optimal given the flows. The bilevel optimization may estimate the minimum increase in departure flow with respect to the marginal increase in green time.

While the illustrative embodiments described above are preferably implemented in hardware, such as in units and circuitry of a processor, various aspects of the illustrative embodiments may be implemented in software as well. For example, it will be understood that each block of the flowchart illustrations in FIGS. 3A-3B, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions, and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

One or more embodiments of the present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions, which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

The corresponding structures, materials, acts, and equivalents of all means or step plus function elements in the claims below are intended to include any structure, material, or act for performing the function in combination with other claimed elements as specifically claimed. The description of the embodiments of the present disclosure has been presented for purposes of illustration and description, but is not intended to be exhaustive or limited to the embodiments in the form disclosed. Many modifications and variations will be apparent to those of ordinary skill in the art without departing from the scope and spirit of the disclosure. The embodiments and examples were chosen and described in order to best explain the principles of the disclosure and the practical application, and to enable others of ordinary skill in the art to understand the disclosure for various embodiments with various modifications as are suited to the particular use contemplated.

A method of reducing one or more network delays by controlling traffic signals through an optimized sensor deployment is disclosed. The method may include: receiving traffic data from one or more sensors; detecting a queue spillback for an intersection; detecting a phase of a plurality of phases causing the queue spillback; calculating an optimal distribution of a green time for each of phase in the plurality of phases; selecting a location for each of the one or more sensors based on the optimal distribution of the green time for each phase; deploying the one or more sensors to the respective locations; connecting the one or more sensors to a respective traffic signal controller, the traffic signal controller connected to a traffic light; and distributing the green time to the one or more sensors to control the green time for a respective traffic light.

A computer program product may include a non-transitory computer-readable storage medium having program instructions embodied therewith for reducing one or more network delays by controlling traffic signals through an optimized sensor deployment. The program instructions may be executable by one or more processors to execute: receiving traffic data from one or more sensors; detecting a queue spillback for an intersection; detecting a phase of a plurality of phases causing the queue spillback; calculating an optimal distribution of a green time for each of phase in the plurality of phases; selecting a location for each of the one or more sensors based on the optimal distribution of the green time for each phase; deploying the one or more sensors to the respective locations; connecting the one or more sensors to a respective traffic signal controller, the traffic signal controller connected to a traffic light; and distributing the green time to the one or more sensors to control the green time for a respective traffic light.

A sensor deployment system for reducing one or, more network delays by controlling traffic signals through an optimized sensor deployment is provided. The sensor deployment system may include: one or more sensors connected to a traffic light via a traffic signal controller and configured to collect traffic data; and a simulator configured to detect a queue spillback for an intersection, detect a phase of a plurality of phases causing the queue spillback, calculate an optimal distribution of a green time for each of phase in the plurality of phases, and select a location for each of the one or more sensors based on the optimal distribution of the green time for each phase. The one or more sensors may be deployed to the respective locations and connected to the traffic signal controller. The system may be configured to distribute the green time to the one or more sensors to control the green time for a respective traffic light.

The programs described herein are identified based upon the application for which they are implemented in a specific embodiment of the disclosure. However, it should be appreciated that any particular program nomenclature herein is used merely for convenience, and thus the disclosure should not be limited to use solely in any specific application identified and/or implied by such nomenclature.

It will be clear that the various features of the foregoing systems and/or methodologies may be combined in any way, creating a plurality of combinations from the descriptions presented above.

It will be further appreciated that embodiments of the present disclosure may be provided in the form of a service deployed on behalf of a customer to offer service on demand.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system for reducing delays in a road network by controlling green-time of one or more traffic signals in the road network, the system comprising:
   a plurality of sensors, each of the plurality of sensors configured to:
      detect presence of a vehicle in one or more regions of the road network, and
      control one or more traffic lights in the road network;
   a processor; and
   a non-transitory computer-readable storage medium comprising program instructions that when executed by the processor, cause the processor to:
      receive current position information relating to the plurality of sensors in the road network,
      determine a first relocation position for at least one of the plurality of sensors in the road network by:
         simulating relocation of the plurality of sensors at a plurality of combinations of relocation positions,
         estimating, for each of the plurality of combination of relocation positions, delay savings corresponding to each of the one or more regions in the road network, wherein delay savings are a difference between a first time delay in the road network when the plurality of sensors are in the current position and a second time delay in the in the road network when the plurality of sensors are in that combination of relocation positions,
         using the delay savings corresponding to each of the one or more regions in the road network for identifying an optimal combination of relocation positions from amongst the plurality of combinations of relocation positions, wherein the optimal combination of relocation positions comprises the first relocation position for the at least one of the plurality of sensors,
      deploy the at least one of the plurality of sensors to the first relocation position,
      connect the at least one of the plurality of sensors to a traffic signal controller of a traffic light at the first relocation position, and
      distribute the green time to the at least one of the plurality of sensors to control the green time of the traffic light.

2. The system of claim 1, wherein the program instructions that cause the processor to determine the first relocation position for at least one of the plurality of sensors in the road network comprise program instructions to determine the first relocation position in response to detecting, using one or more of the plurality of sensors, a queue spillback at a region in the road network.

3. The system of claim 2, wherein detecting, using one or more of the plurality of sensors, the queue spillback comprises:
   receiving data from one or more of the following:
      an on-board sensor of at least one connected vehicle,
      a plurality of loop sensors in the road network, or
      automatic vehicle identification sensors,
      a plurality of probe vehicles in the road networks, or
      one or more mobile devices in the road network; and
   using the received data to detect the queue spillback.

4. The system of claim 1, wherein the program instructions that cause the processor to determine the first relocation position for at least one of the plurality of sensors in the road network comprise program instructions to determine the first relocation position sequentially based on demand realization at different times during a given time period.

5. The system of claim 4, wherein simulating relocation of the plurality of sensors at the plurality of combinations of relocation positions is subject to a constraint corresponding to maximum number of relocations associated with each of the plurality of sensors during the time period.

6. The system of claim 4, wherein simulating relocation of the plurality of sensors at the plurality of combinations of relocation positions is subject to a constraint corresponding to total available number of sensors.

7. The system of claim 4, wherein simulating relocation of the plurality of sensors at the plurality of combinations of relocation positions is subject to a constraint corresponding to the delay savings determined based on a ratio of connected vehicles in the road network.

8. The system of claim 1, wherein estimating, for each of the plurality of combination of relocation positions, delay savings corresponding to each of the one or more regions in the road network comprises modeling dynamic route choices of a plurality of drivers in the road network based on simulated time-dependent travel times.

9. The system of claim 1, wherein for a combination of relocation positions, delay savings at each of the one or more regions of the road network, comprise at least one of the following:
- a direct effect of the combination of relocation positions on delay at that region; or
- an indirect effect on delay at that region as a function of delays at one or more neighboring regions.

10. The system of claim 1, wherein the program instructions that cause the processor to determine the first relocation position for at least one of the plurality of sensors in the road network comprise program instructions to cause the processor to determine the first relocation position in a rolling horizon manner until the end of a time period.

11. A method for reducing delays in a road network by controlling green-time of one or more traffic signals in the road network, the method comprising, by a processor:
- receiving current position information relating to a plurality of sensors in the road network, wherein each of the plurality of sensors is configured to detect presence of a vehicle in one or more regions of the road network;
- determining a first relocation position for at least one of the plurality of sensors in the road network by:
  - simulating relocation of the plurality of sensors at a plurality of combinations of relocation positions,
  - estimating, for each of the plurality of combination of relocation positions, delay savings corresponding to each of the one or more regions in the road network, wherein delay savings are a difference between a first time delay in the road network when the plurality of sensors are in the current position and a second time delay in the in the road network when the plurality of sensors are in that combination of relocation positions,
  - using the delay savings corresponding to each of the one or more regions in the road network for identifying an optimal combination of relocation positions from amongst the plurality of combinations of relocation positions, wherein the optimal combination of relocation positions comprises the first relocation position for the at least one of the plurality of sensors,
- deploying the at least one of the plurality of sensors to the first relocation position;
- connecting the at least one of the plurality of sensors to a traffic signal controller of a traffic light at the first relocation position; and
- distributing the green time to the at least one of the plurality of sensors to control the green time of the traffic light.

12. The method of claim 11, wherein determining the first relocation position for at least one of the plurality of sensors in the road network comprises determining the first relocation position in response to detecting, using one or more of the plurality of sensors, a queue spillback at a region in the road network.

13. The method of claim 12, wherein detecting, using one or more of the plurality of sensors, the queue spillback comprises:
- receiving data from one or more of the following:
  - an on-board sensor of at least one connected vehicle,
  - a plurality of loop sensors in the road network, or automatic vehicle identification sensors,
  - a plurality of probe vehicles in the road networks, or
  - one or more mobile devices in the road network; and
- using the received data to detect the queue spillback.

14. The method of claim 11, wherein determining the first relocation position for at least one of the plurality of sensors in the road network comprises determining the first relocation position sequentially based on demand realization at different times during a given time period.

15. The method of claim 14, wherein simulating relocation of the plurality of sensors at the plurality of combinations of relocation positions is subject to a constraint corresponding to maximum number of relocations associated with each of the plurality of sensors during the time period.

16. The method of claim 15, wherein simulating relocation of the plurality of sensors at the plurality of combinations of relocation positions is subject to a constraint corresponding to total available number of sensors.

17. The method of claim 15, wherein simulating relocation of the plurality of sensors at the plurality of combinations of relocation positions is subject to a constraint corresponding to the delay savings determined based on a ratio of connected vehicles in the road network.

18. The method of claim 11, wherein estimating, for each of the plurality of combination of relocation positions, delay savings corresponding to each of the one or more regions in the road network comprises modeling dynamic route choices of a plurality of drivers in the road network based on simulated time-dependent travel times.

19. The method of claim 11, wherein for a combination of relocation positions, delay savings at each of the one or more regions of the road network, comprise at least one of the following:
- a direct effect of the combination of relocation positions on delay at that region; or
- an indirect effect on delay at that region as a function of delays at one or more neighboring regions.

20. The method of claim 11, wherein determining the first relocation position for at least one of the plurality of sensors in the road network comprises determining the first relocation position in a rolling horizon manner until the end of a time period.

* * * * *